United States Patent
Weng et al.

(10) Patent No.: US 11,822,237 B2
(45) Date of Patent: Nov. 21, 2023

(54) METHOD OF MANUFACTURING A SEMICONDUCTOR DEVICE

(71) Applicant: TAIWAN SEMICONDUCTOR MANUFACTURING CO., LTD., Hsinchu (TW)

(72) Inventors: Ming-Hui Weng, New Taipei (TW); Chen-Yu Liu, Kaohsiung (TW); Chih-Cheng Liu, Hsinchu (TW); Yi-Chen Kuo, Taichung (TW); Jia-Lin Wei, Hsinchu (TW); Yen-Yu Chen, Taipei (TW); Jr-Hung Li, Chupei (TW); Yahru Cheng, Taipei (TW); Chi-Ming Yang, Hsinchu (TW); Tze-Liang Lee, Hsinchu (TW); Ching-Yu Chang, Yilang County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 499 days.

(21) Appl. No.: 17/071,004

(22) Filed: Oct. 15, 2020

(65) Prior Publication Data
US 2021/0302833 A1 Sep. 30, 2021

Related U.S. Application Data

(60) Provisional application No. 63/025,956, filed on May 15, 2020, provisional application No. 63/002,264, filed on Mar. 30, 2020.

(51) Int. Cl.
*G03F 7/004* (2006.01)
*H01L 21/033* (2006.01)
*G03F 7/00* (2006.01)

(52) U.S. Cl.
CPC .......... *G03F 7/004* (2013.01); *G03F 7/0035* (2013.01); *H01L 21/0332* (2013.01)

(58) Field of Classification Search
CPC ...... G03F 7/004; G03F 7/0035; G03F 7/0042; G03F 7/11; G03F 7/38; G03F 7/167;
(Continued)

(56) References Cited

U.S. PATENT DOCUMENTS 9,310,684 B2   4/2016   Meyers et al.
11,139,200 B2  10/2021  Liou et al.
(Continued)

FOREIGN PATENT DOCUMENTS

JP   2020-038320 A    3/2020
KR   10-2013-0039299 A  4/2013
(Continued)

*Primary Examiner* — Caleen O Sullivan
(74) *Attorney, Agent, or Firm* — Studebaker & Brackett PC

(57) ABSTRACT

A method of manufacturing a semiconductor device includes forming a photoresist layer over a substrate, including combining a first precursor and a second precursor in a vapor state to form a photoresist material, and depositing the photoresist material over the substrate. A protective layer is formed over the photoresist layer. The photoresist layer is selectively exposed to actinic radiation through the protective layer to form a latent pattern in the photoresist layer. The protective layer is removed, and the latent pattern is developed by applying a developer to the selectively exposed photoresist layer to form a pattern.

20 Claims, 24 Drawing Sheets

(58) Field of Classification Search
CPC .......... G03F 7/091; G03F 7/2004; G03F 7/26; H01L 21/0332; H01L 21/0274
USPC ................ 430/311, 270.1, 271.1, 272.1
See application file for complete search history.

(56) References Cited

U.S. PATENT DOCUMENTS

| | | |
|---|---|---|
| 2012/0088369 A1 | 4/2012 | Weidman et al. |
| 2013/0089820 A1 | 4/2013 | Hatakeyama et al. |
| 2015/0056555 A1* | 2/2015 | Lin ................ G03F 7/0397 430/311 |
| 2017/0168398 A1 | 6/2017 | Zi et al. |
| 2018/0315617 A1 | 11/2018 | Zi et al. |
| 2020/0057375 A1 | 2/2020 | Yu et al. |
| 2020/0064733 A1 | 2/2020 | Meyers et al. |
| 2021/0305040 A1* | 9/2021 | Kuo ................ G03F 7/0042 |
| 2021/0325780 A1 | 10/2021 | Yamada et al. |

FOREIGN PATENT DOCUMENTS

| | | |
|---|---|---|
| TW | I456352 B | 10/2014 |
| TW | 202007691 A | 2/2020 |
| TW | 202011455 A | 3/2020 |
| WO | 2019/217749 A1 | 11/2019 |

\* cited by examiner

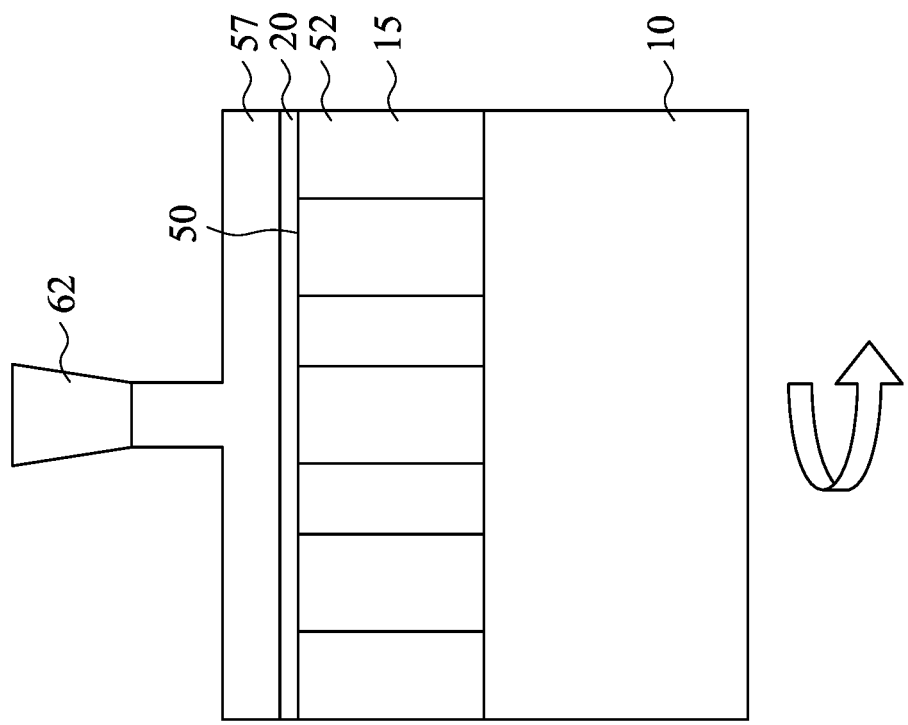

examples:

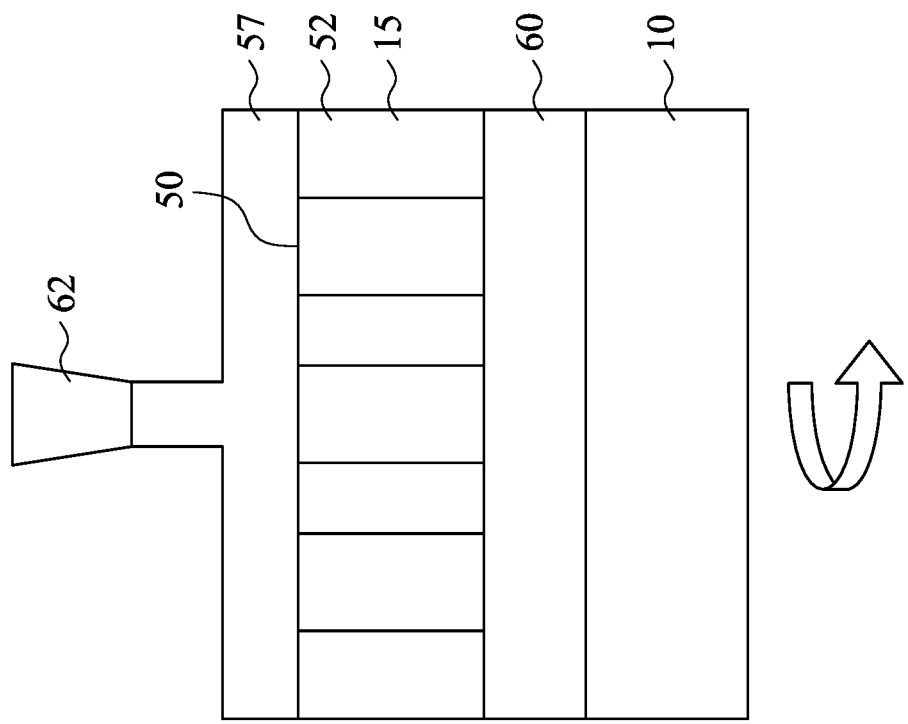

METHOD OF MANUFACTURING A SEMICONDUCTOR DEVICE

RELATED APPLICATIONS

This application claims priority to U.S. Provisional Patent Application No. 63/002,264 filed Mar. 30, 2020, and U.S. Provisional Patent Application No. 63/025,956 filed May 15, 2020, the entire contents of each of which are incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface of a layer to be patterned and then exposed to an energy that has itself been patterned. Such an exposure modifies the chemical and physical properties of the exposed regions of the photosensitive material. This modification, along with the lack of modification in regions of the photosensitive material that were not exposed, can be exploited to remove one region without removing the other.

However, as the size of individual devices has decreased, process windows for photolithographic processing have become tighter and tighter. As such, advances in the field of photolithographic processing are necessary to maintain the ability to scale down the devices, and further improvements are needed in order to meet the desired design criteria such that the march towards smaller and smaller components may be maintained.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 6A, 6B, and 6C show a process stage of a sequential operation according to an embodiment of the disclosure.

FIGS. 16A, 16B, and 16C show a process stage of a sequential operation according to an embodiment of the disclosure.

DETAILED DESCRIPTION

Figure 1:
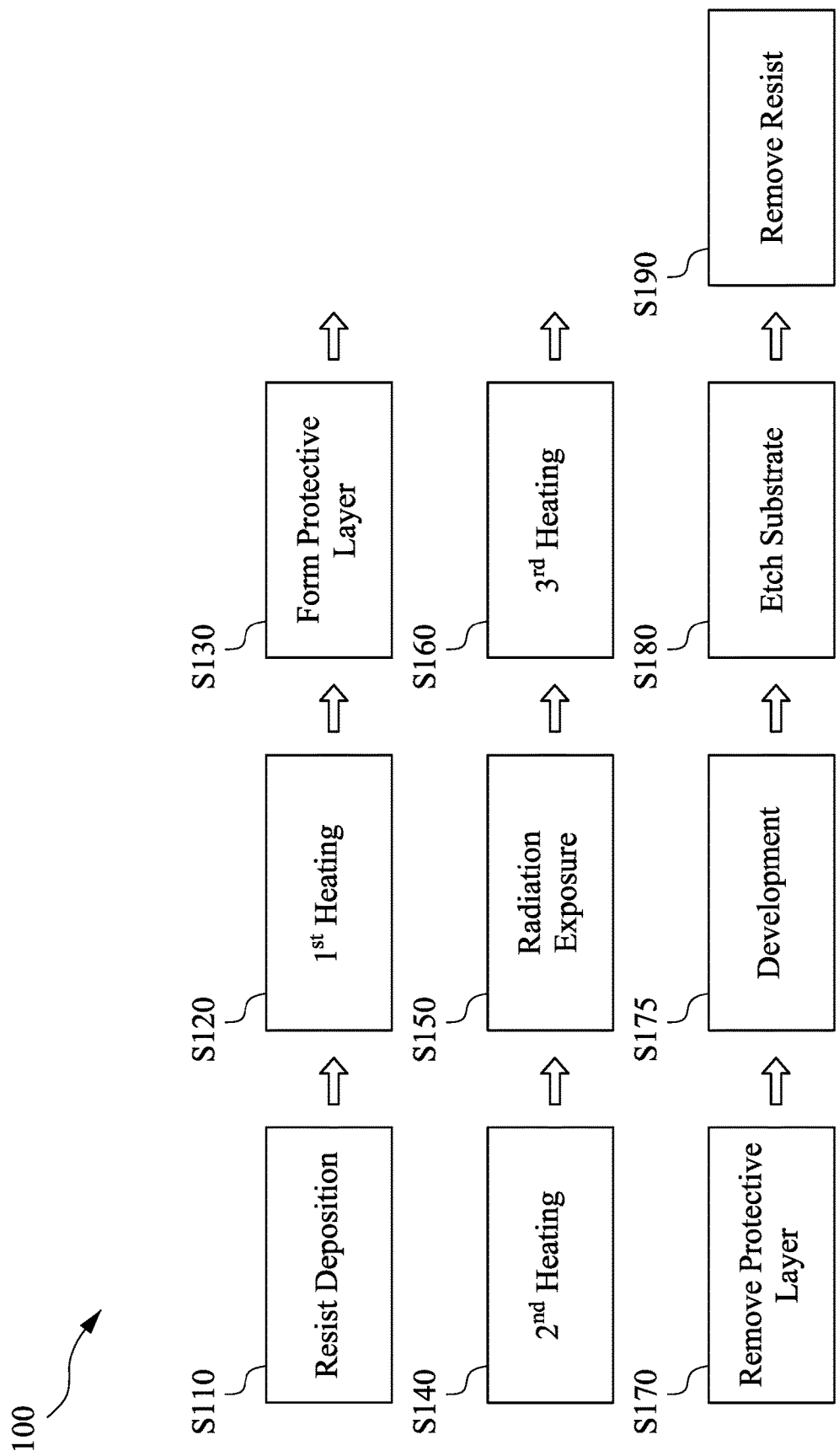
FIG. 1 illustrates a process flow of manufacturing a semiconductor device according to embodiments of the disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

As the semiconductor industry has progressed into nanometer technology process nodes in pursuit of higher device density, higher performance, and lower costs, there have been challenges in reducing semiconductor feature size. Extreme ultraviolet lithography (EUVL) has been developed to form smaller semiconductor device feature size and increase device density on a semiconductor wafer. In order to improve EUVL, an increase in wafer exposure throughput is desirable. Wafer exposure throughput can be improved through increased exposure power or increased resist photospeed (sensitivity).

Metal-containing photoresists are used in extreme ultraviolet (EUV) lithography because metals have a high absorption capacity of extreme ultraviolet radiation and thus increase the resist photospeed. Metal-containing photoresist layers, however, may outgas during processing which can cause the photoresist layer quality to change over time and may cause contamination to the semiconductor device processing chambers, handling equipment, such as front opening unified pods (FOUPs), and other semiconductor wafers, thereby negatively affecting lithography performance, and increasing defects.

Photoresist layer formation and patterning operations that substantially reduce or prevent metal contamination of the processing chambers, substrate handling equipment, and other wafers from the metals in metal-containing photoresists is desirable.

Figure 2:
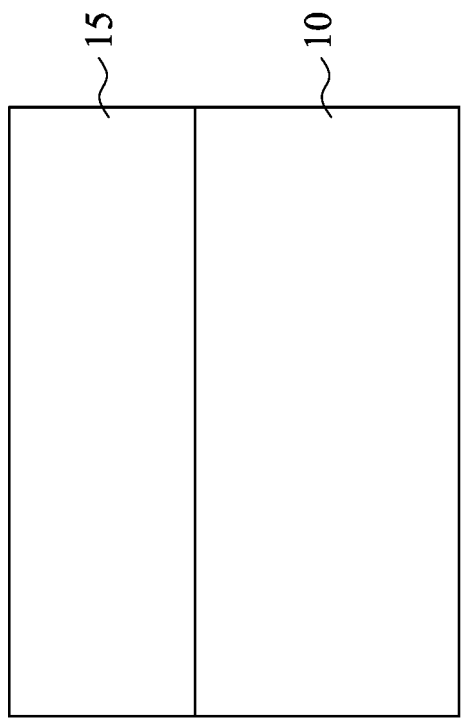
FIG. 2 shows a process stage of a sequential operation according to an embodiment of the disclosure.

In embodiments of the disclosure, the above issues are addressed by forming a protective layer over a metal-containing photoresist layer on a substrate. In addition, embodiments of the disclosure include solvent free photoresist layer formation, thus providing a greener process. FIG. 1 illustrates a process flow 100 of manufacturing a semiconductor device according to embodiments of the disclosure. A resist is coated on a surface of a layer to be patterned or a substrate 10 in operation S110, in some embodiments, to form a resist layer 15, as shown in FIG. 2. In some embodiments, the resist is a metal-containing photoresist formed by CVD or ALD. In some embodiments, the resist layer 15 then undergoes a first heating operation S120 after being deposited. In other embodiments, the metal-containing photoresist layer is formed by a spin-coating method. In some embodiments, the resist layer is heated to a temperature of between about 40° C. and about 150° C. for about 10 seconds to about 10 minutes.

Figure 3:
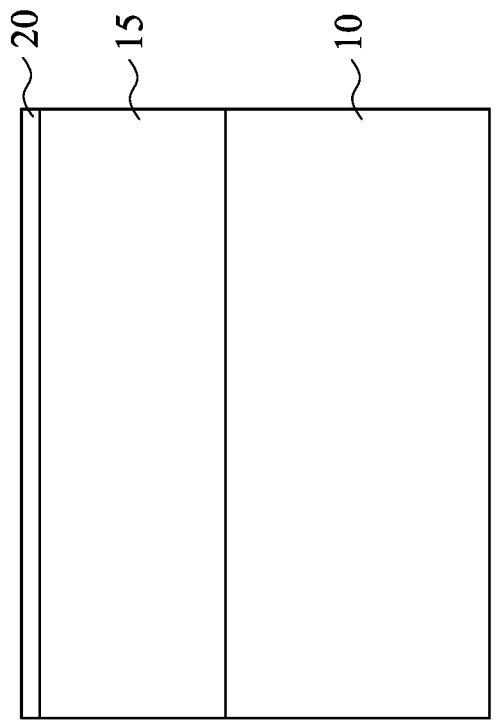
FIG. 3 shows a process stage of a sequential operation according to an embodiment of the disclosure.

After the optional first heating operation S120 or the resist deposition operation S110, a protective layer 20 is formed over the resist layer 15 in operation S130, as shown in FIG. 3. In some embodiments, the protective layer 20 is formed over the resist layer 15 by a spin coating operation. The protective layer 20 is subsequently heated in a second heating operation S140 to remove solvents or dry the protective layer in some embodiments. In some embodiments, the second heating operation S140 is performed at a temperature of between about 40° C. and about 150° C. for about 10 seconds to about 10 minutes.

The resist layer 15 and protective layer 20 are subsequently selectively exposed to actinic radiation 45/97 (see FIGS. 4A and 4B) in operation S150. The resist layer 15 is exposed to actinic radiation 45/97 through the protective layer 20. In some embodiments, the actinic radiation 45/97 is not substantially absorbed by the protective layer 20. In some embodiments, the photoresist layer 15 is selectively or patternwise exposed to ultraviolet radiation. In some embodiments, the ultraviolet radiation is deep ultraviolet radiation (DUV). In some embodiments, the ultraviolet radiation is extreme ultraviolet (EUV) radiation. In some embodiments, the resist layer 15 is selectively or patternwise exposed to an electron beam. In some embodiments, the resist layer 15 is a photoresist layer that is photosensitive to the actinic radiation 45/97 and the protective layer 20 is not a photoresist layer and is not photosensitive to the actinic radiation 45/97. Photoresist layers according to the present disclosure are layers that undergo a chemical reaction upon absorption of the actinic radiation causing portions of the photoresist layer that are exposed to the actinic radiation to change solubility in a developer in contrast to portions of the photoresist layer that are not exposed to the actinic radiation.

The layers that are not photosensitive to the actinic radiation do not substantially undergo a chemical reaction to change the layer's solubility in a developer upon exposure to the actinic radiation.

Figure 4A:
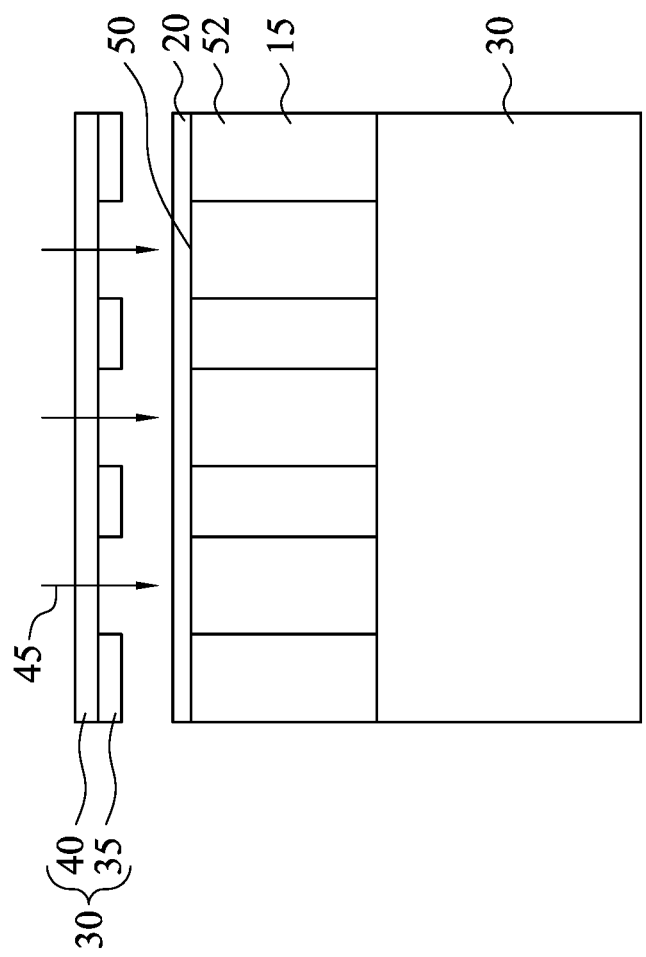
FIGS. 4A and 4B show a process stage of a sequential operation according to an embodiment of the disclosure.

As shown in FIG. 4A, the exposure radiation 45 passes through a photomask 30 before irradiating the photoresist layer 15 in some embodiments. In some embodiments, the photomask 30 has a pattern to be replicated in the photoresist layer 15. The pattern is formed by an opaque pattern 35 on the photomask substrate 40, in some embodiments. The opaque pattern 35 may be formed by a material opaque to ultraviolet radiation, such as chromium, while the photomask substrate 40 is formed of a material that is transparent to ultraviolet radiation, such as fused quartz.

Figure 4B:
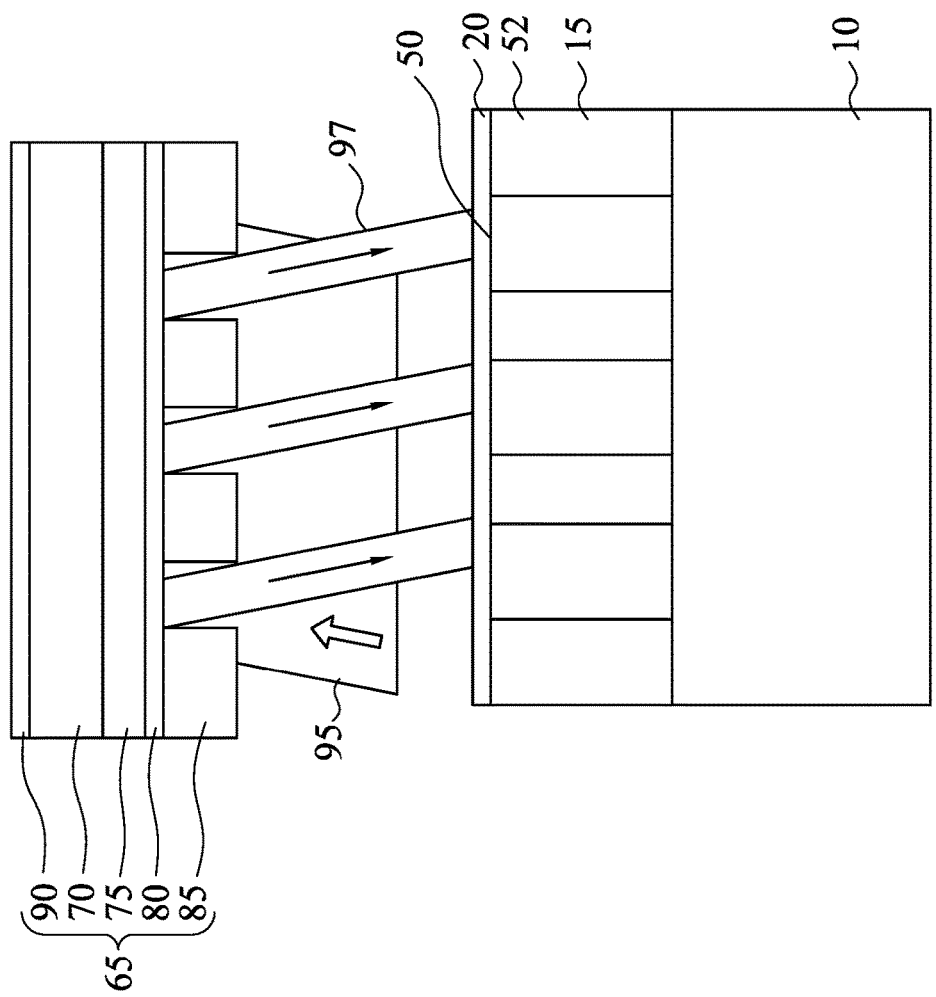

In some embodiments, the selective or patternwise exposure of the photoresist layer 15 to form exposed regions 50 and unexposed regions 52 is performed using extreme ultraviolet lithography. In an extreme ultraviolet lithography operation a reflective photomask 65 is used to form the patterned exposure light in some embodiments, as shown in FIG. 4B. The reflective photomask 65 includes a low thermal expansion glass substrate 70, on which a reflective multilayer 75 of Si and Mo is formed. A capping layer 80 and absorber layer 85 are formed on the reflective multilayer 75. A rear conductive layer 90 is formed on the back side of the low thermal expansion substrate 70. Extreme ultraviolet radiation 95 is directed towards the reflective photomask 65 at an incident angle of about 6°. A portion 97 of the extreme ultraviolet radiation is reflected by the Si/Mo multilayer 75 towards the photoresist-coated substrate 10, while the portion of the extreme ultraviolet radiation incident upon the absorber layer 85 is absorbed by the photomask. In some embodiments, additional optics, including mirrors, are located between the reflective photomask 65 and the photoresist-coated substrate 10.

In some embodiments, the exposure to radiation is carried out by placing the photoresist-coated substrate in a photolithography tool. The photolithography tool includes a photomask 30/65, optics, an exposure radiation source to provide the radiation 45/97 for exposure, and a movable stage for supporting and moving the substrate under the exposure radiation.

In some embodiments, optics (not shown) are used in the photolithography tool to expand, reflect, or otherwise control the radiation before or after the radiation 45/97 is patterned by the photomask 30/65. In some embodiments, the optics include one or more lenses, mirrors, filters, and combinations thereof to control the radiation 45/97 along its path.

In some embodiments, the radiation is electromagnetic radiation, such as g-line (wavelength of about 436 nm), i-line (wavelength of about 365 nm), ultraviolet radiation, far ultraviolet radiation, extreme ultraviolet, electron beams, or the like. In some embodiments, the radiation source is selected from the group consisting of a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm), or a $CO_2$ laser-excited Sn plasma (extreme ultraviolet, wavelength of 13.5 nm).

The amount of electromagnetic radiation can be characterized by a fluence or dose, which is obtained by the integrated radiative flux over the exposure time. Suitable radiation fluences range from about 1 $mJ/cm^2$ to about 150 $mJ/cm^2$ in some embodiments, from about 2 $mJ/cm^2$ to about 100 $mJ/cm^2$ in other embodiments, and from about 3 $mJ/cm^2$ to about 50 $mJ/cm^2$ in other embodiments. A person of ordinary skill in the art will recognize that additional ranges of radiation fluences within the explicit ranges above are contemplated and are within the present disclosure.

In some embodiments, the selective or patternwise exposure is performed by a scanning electron beam. With electron beam lithography, the electron beam induces secondary electrons, which modify the irradiated material. High resolution is achievable using electron beam lithography and the metal-containing resists disclosed herein. Electron beams can be characterized by the energy of the beam, and suitable energies range from about 5 V to about 200 kV (kilovolt) in some embodiments, and from about 7.5 V to about 100 kV in other embodiments. Proximity-corrected beam doses at 30 kV range from about 0.1 $\mu C/cm^2$ to about 5 $\mu C/cm^2$ in some embodiments, from about 0.5 $\mu C/cm^2$ to about 1 $\mu C/cm^2$ in other embodiments, and in other embodiments from about 1 $\mu C/cm^2$ to about 100 $\mu C/cm^2$. A person of ordinary skill in the art can compute corresponding doses at other beam energies based on the teachings herein and will recognize that additional ranges of electron beam properties within the explicit ranges above are contemplated and are within the present disclosure.

The region of the resist layer exposed to radiation 50 undergoes a chemical reaction thereby changing its susceptibility to being removed in a subsequent development operation S175. In some embodiments, the portion of the resist layer exposed to radiation 50 undergoes a reaction making the exposed portion more easily removed during the development operation S175. In other embodiments, the portion of the resist layer exposed to radiation 50 undergoes a reaction making the exposed portion resistant to removal during the development operation S175.

Next, the resist layer 15 undergoes a third heating or a post-exposure bake (PEB) in operation S160. In some embodiments, the photoresist layer 15 is heated to a temperature of about 50° C. to about 250° C. for about 20 seconds to about 300 seconds. In some embodiments, the post-exposure baking is performed at a temperature ranging from about 100° C. to about 230° C., and at a temperature ranging from about 150° C. to about 200° C. in other embodiments. In some embodiments, the post-exposure baking operation S160 causes the reaction product of the first compound or first precursor and the second compound or second precursor to crosslink.

Figure 5:
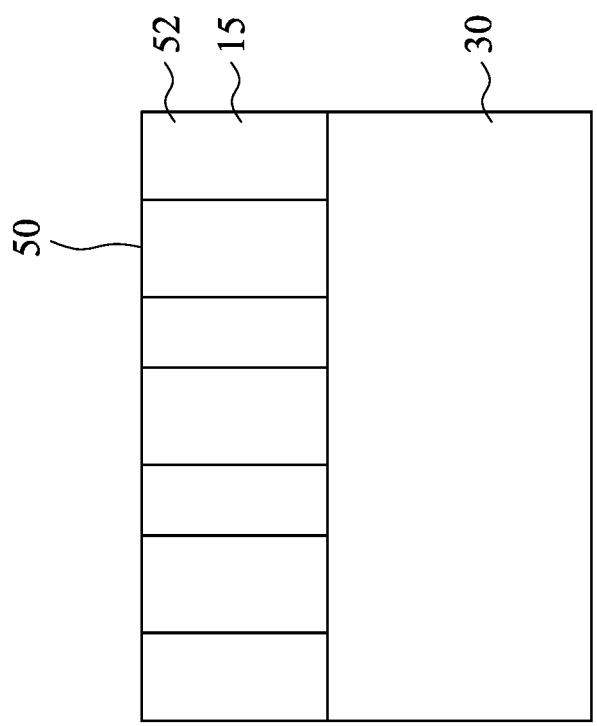
FIG. 5 shows a process stage of a sequential operation according to an embodiment of the disclosure.

In some embodiments, the protective layer 20 is removed in operation S170, as shown in FIG. 5, after the post-exposure bake operation S160. In some embodiments, the protective layer 20 prevents outgassing of the metal-containing resist layer 15. For example, during the post-exposure baking operation S160, smaller metal-containing compounds in the resist layer may become volatile during the post-exposure baking operation and outgas from the resist layer 15. The metal-containing compounds may contaminate the processing tool, semiconductor wafer handling tools, or other semiconductor wafers undergoing processing. The protective layer 20 prevents metal-containing contaminants from outgassing from the resist layer 15. In some embodiments, the protective layer 20 is removed by a suitable solvent.

Figure 6A:
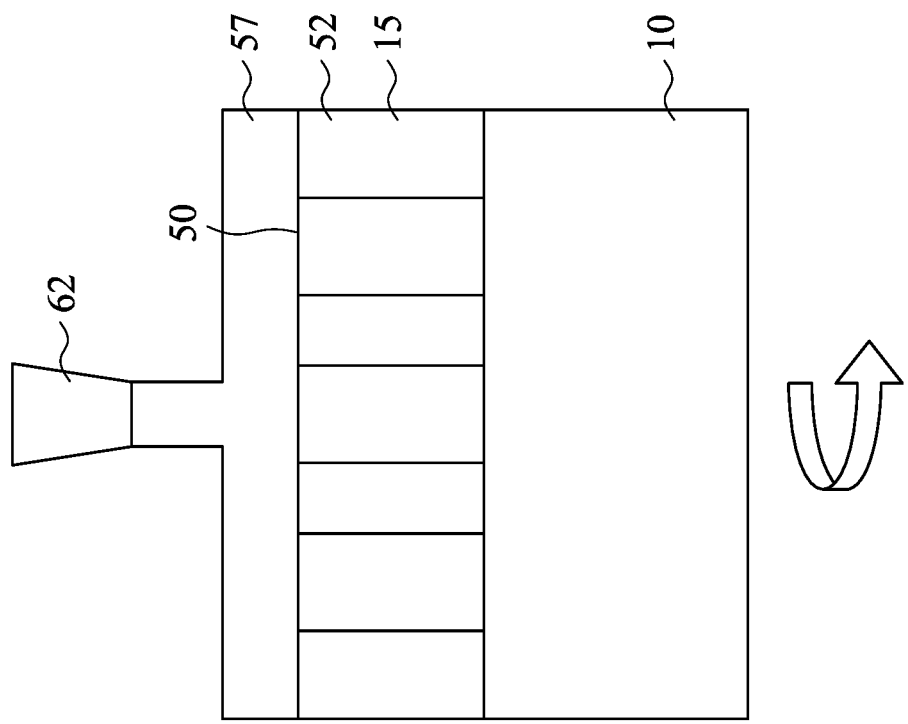
Figure 7:
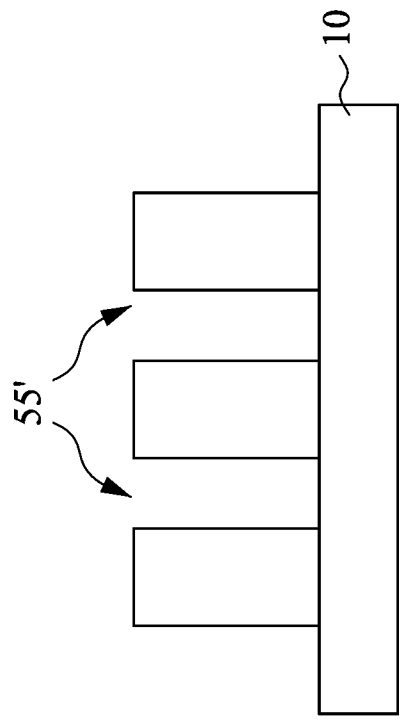
FIG. 7 shows a process stage of a sequential operation according to an embodiment of the disclosure.

The selectively exposed resist layer is subsequently developed in operation S175. In some embodiments, the resist layer 15 is developed by applying a solvent-based developer 57 to the selectively exposed resist layer. As shown in FIG. 6A, a liquid developer 57 is supplied from a dispenser 62 to the resist layer 15. In some embodiments, the exposed portions 50 of the photoresist undergo a crosslinking reaction as a result of the exposure to actinic radiation or the post-exposure bake, and the unexposed portion of the photoresist layer 52 is removed by the developer 57 forming a pattern of openings 55 in the photoresist layer 15 to expose the substrate 20, as shown in FIG. 7.

In some embodiments, the resist developer 57 includes a solvent, and an acid or a base. In some embodiments, the concentration of the solvent is from about 60 wt. % to about 99 wt. % based on the total weight of the resist developer. The acid or base concentration is from about 0.001 wt. % to about 20 wt. % based on the total weight of the resist developer. In certain embodiments, the acid or base concentration in the developer is from about 0.01 wt. % to about 15 wt. % based on the total weight of the resist developer.

In some embodiments, the developer 57 is applied to the resist layer 15 using a spin-on process. In the spin-on process, the developer 57 is applied to the resist layer 15 from above the resist layer 15 while the resist-coated substrate is rotated, as shown in FIG. 6A. In some embodiments, the developer 57 is supplied at a rate of between about 5 ml/min and about 800 ml/min, while the photoresist coated substrate 10 is rotated at a speed of between about 100 rpm and about 2000 rpm. In some embodiments, the developer is at a temperature of between about 10° C. and about 80° C. The development operation continues for between about 30 seconds to about 10 minutes in some embodiments.

In some embodiments, the developer 57 is an organic solvent. The organic solvent can be any suitable solvent. In some embodiments, the solvent is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, 4-methyl-2-pentanol, acetone, methyl ethyl ketone, dimethylformamide (DMF), isopropanol (IPA), tetrahydrofuran (THF), methyl isobutyl carbinol (MIBC), n-butyl acetate (nBA), 2-heptanone (MAK), tetrahydrofuran (THF), and dioxane.

In some embodiments, the protective layer 20 remains on the resist layer 15 until the development operation S175 and the protective layer 20 is removed during the development operation S175, as shown in FIG. 6B. In some embodiments, the protective layer 20 is soluble in the developer 57.

While the spin-on operation is one suitable method for developing the photoresist layer 15 after exposure, it is intended to be illustrative and is not intended to limit the embodiment. Rather, any suitable development operations, including dip processes, puddle processes, and spray-on methods, may alternatively be used. All such development operations are included within the scope of the embodiments.

Figure 6C:
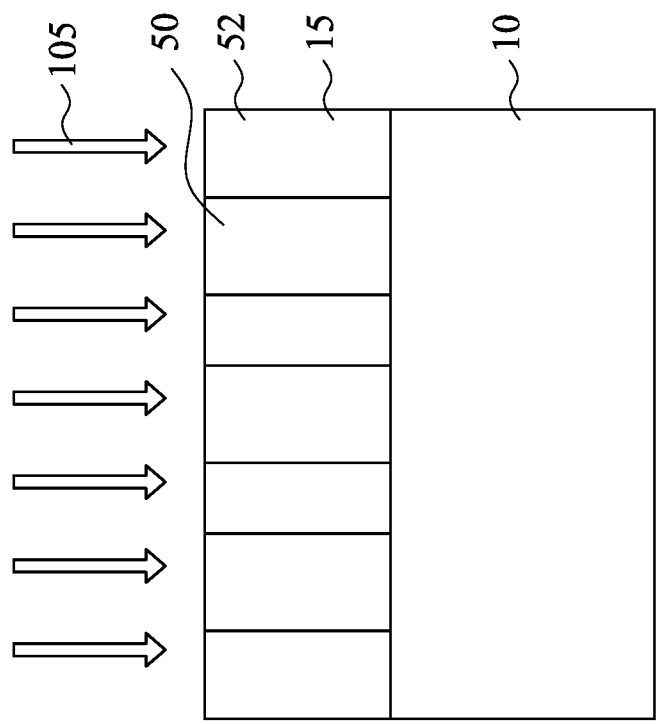

In some embodiments, a dry developer 105 is applied to the selectively exposed resist layer 15, as shown in FIG. 6C. In some embodiments, the dry developer 105 is a plasma or chemical vapor, and the dry development operation S180 is a plasma etching or chemical etching operation. The dry development uses the differences related to the composition, extent of crosslinking, and film density to selectively remove the desired portions of the resist. In some embodiments, the dry development processes uses either a gentle plasma (high pressure, low power) or a thermal process in a heated vacuum chamber while flowing a dry development chemistry, such as $BCl_3$, $BF_3$, or other Lewis Acid in the vapor state. In some embodiments, the $BCl_3$ removes the unexposed material, leaving behind a pattern of the exposed film that is transferred into the underlying layers by plasma-based etch processes.

In some embodiments, the dry development includes plasma processes, including transformer coupled plasma (TCP), inductively coupled plasma (ICP) or capacitively coupled plasma (CCP). In some embodiments, the plasma process is conducted at a pressure ranging from about 5 mTorr to about 20 mTorr, at a power level from about 250 W to about 1000 W, a temperature ranging from about 0° C. to about 300° C., and at a flow rate of about 100 to about 1000 sccm, for about 1 to about 3000 seconds.

Figure 8:
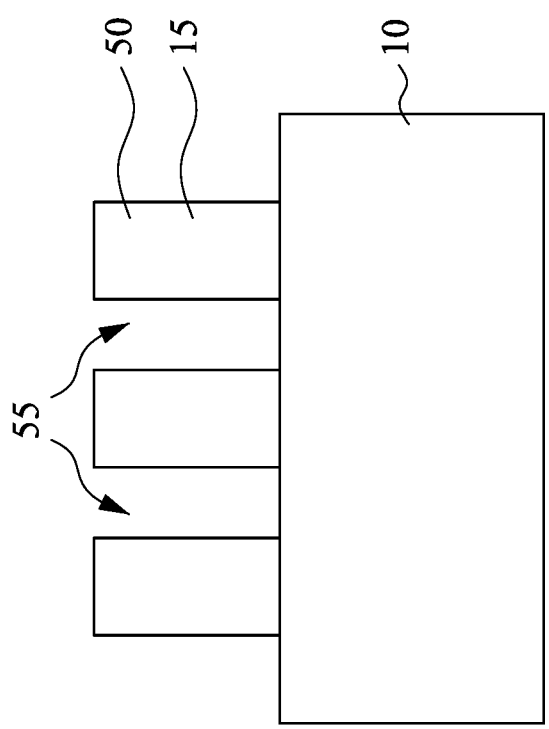
FIG. 8 shows a process stage of a sequential operation according to an embodiment of the disclosure.

After the development operation, additional processing is performed while the patterned photoresist layer 50 is in place. For example, an etching operation, using dry or wet etching, is performed in some embodiments, to transfer the pattern of the resist layer 50 to the underlying substrate 10, forming recesses 55' as shown in FIG. 8. The substrate 10 has a different etch resistance than the resist layer 15. In some embodiments, the etchant is more selective to the substrate 10 than the resist layer 15.

In some embodiments, the exposed resist layer 15 is at least partially removed during the etching operation in some embodiments. In other embodiments, the exposed resist layer 15 is removed after etching the substrate 10 by selective etching, using a suitable resist stripper solvent, or by a resist plasma ashing operation.

In some embodiments, the substrate 10 includes a single crystalline semiconductor layer on at least it surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 10 is a silicon layer of an SOI (silicon-on insulator) substrate. In certain embodiments, the substrate 10 is made of crystalline Si.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate 10. The germanium concentration of the SiGe buffer layers may increase from 30 atomic % for the bottom-most buffer layer to 70 atomic % for the top-most buffer layer.

In some embodiments, the substrate 10 includes one or more layers of at least one metal, metal alloy, and metal nitride/sulfide/oxide/silicide having the formula $MX_a$, where M is a metal and X is N, S, Se, O, Si, and a is from about 0.4 to about 2.5. In some embodiments, the substrate 10 includes titanium, aluminum, cobalt, ruthenium, titanium nitride, tungsten nitride, tantalum nitride, and combinations thereof.

In some embodiments, the substrate 10 includes a dielectric material having at least a silicon or metal oxide or nitride of the formula $MX_b$, where M is a metal or Si, X is N or O, and b ranges from about 0.4 to about 2.5. In some embodiments, the substrate 10 includes silicon dioxide, silicon nitride, aluminum oxide, hafnium oxide, lanthanum oxide, and combinations thereof.

The photoresist layer 15 is a photosensitive layer that is patterned by exposure to actinic radiation. Typically, the chemical properties of the photoresist regions struck by incident radiation change in a manner that depends on the type of photoresist used. Photoresist layers 15 are either positive tone resists or negative tone resists. A positive tone resist refers to a photoresist material that when developed, the portions of the photoresist layer exposed to actinic radiation, such as UV light, are removed, while the region of the photoresist that is non-exposed (or exposed less) remains on the substrate after the development operation. A negative tone resist, on the other hand, refers to a photoresist material that when developed, the portions of the photoresist exposed to actinic radiation remain on the substrate after the development operation, while the region of the photoresist that is non-exposed (or exposed less) is removed during the development operation.

Figure 9A:
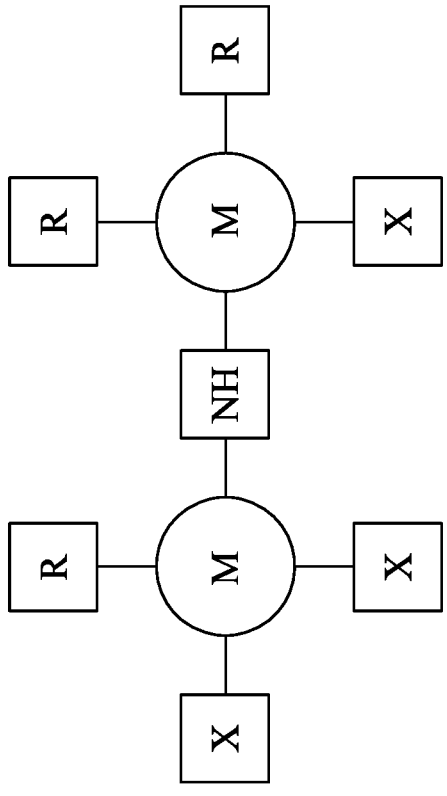
FIGS. 9A, 9B, and 9C show organometallic precursors according to embodiments of the disclosure.
Figure 9A:
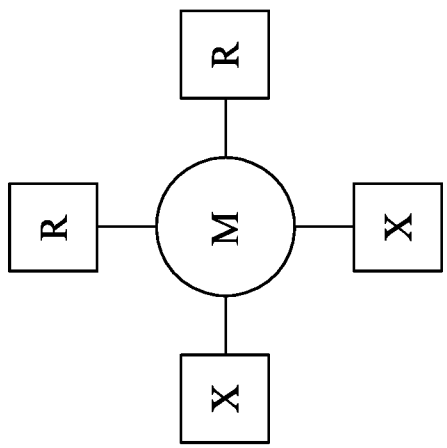

In some embodiments, the photoresist layer 15 is made of a photoresist composition, including a first compound or a first precursor and a second compound or a second precursor combined in a vapor state. The first precursor or first compound is an organometallic having a formula: $M_aR_bX_c$, as shown in FIG. 9A, where M is at least one of Sn, Bi, Sb, In, Te, Ti, Zr, Hf, V, Co, Mo, W, Al, Ga, Si, Ge, P, As, Y, La, Ce, or Lu; and R is a substituted or unsubstituted alkyl, alkenyl, or carboxylate group. In some embodiments, M is selected from the group consisting of Sn, Bi, Sb, In, Te, and combinations thereof. In some embodiments, R is a C3-C6 alkyl, alkenyl, or carboxylate. In some embodiments, R is selected from the group consisting of propyl, isopropyl, butyl, iso-butyl, sec-butyl, tert-butyl, pentyl, isopentyl, sec-pentyl, tert-pentyl, hexyl, iso-hexyl, sec-hexyl, tert-hexyl, and combinations thereof. X is a ligand, ion, or other moiety, which is reactive with the second compound or second precursor; and $1 \leq a \leq 2$, $b \geq 1$, $c \geq 1$, and $b+c \leq 5$ in some embodiments. In some embodiments, the alkyl, alkenyl, or carboxylate group is substituted with one or more fluoro groups. In some embodiments, the organometallic precursor is a dimer, as shown in FIG. 9A, where each monomer unit is linked by an amine group. Each monomer has a formula: $M_aR_bX_c$, as defined above.

In some embodiments, R is alkyl, such as $C_nH_{2n+1}$ where $n \geq 3$. In some embodiments, R is fluorinated, e.g., having the formula $C_nF_xH_{(2n+)-x}$. In some embodiments, R has at least one beta-hydrogen or beta-fluorine. In some embodiments, R is selected from the group consisting of i-propyl, n-propyl, t-butyl, i-butyl, n-butyl, sec-butyl, n-pentyl, i-pentyl, t-pentyl, and sec-pentyl, and combinations thereof.

In some embodiments, X is any moiety readily displaced by the second compound or second precursor to generate an M-OH moiety, such as a moiety selected from the group consisting of amines, including dialkylamino and monalkylamino; alkoxy; carboxylates, halogens, and sulfonates. In some embodiments, the sulfonate group is substituted with one or more amine groups. In some embodiments, the halide is one or more selected from the group consisting of F, Cl, Br, and I. In some embodiments, the sulfonate group includes a substituted or unsubstituted C1-C3 group.

Figure 9B:
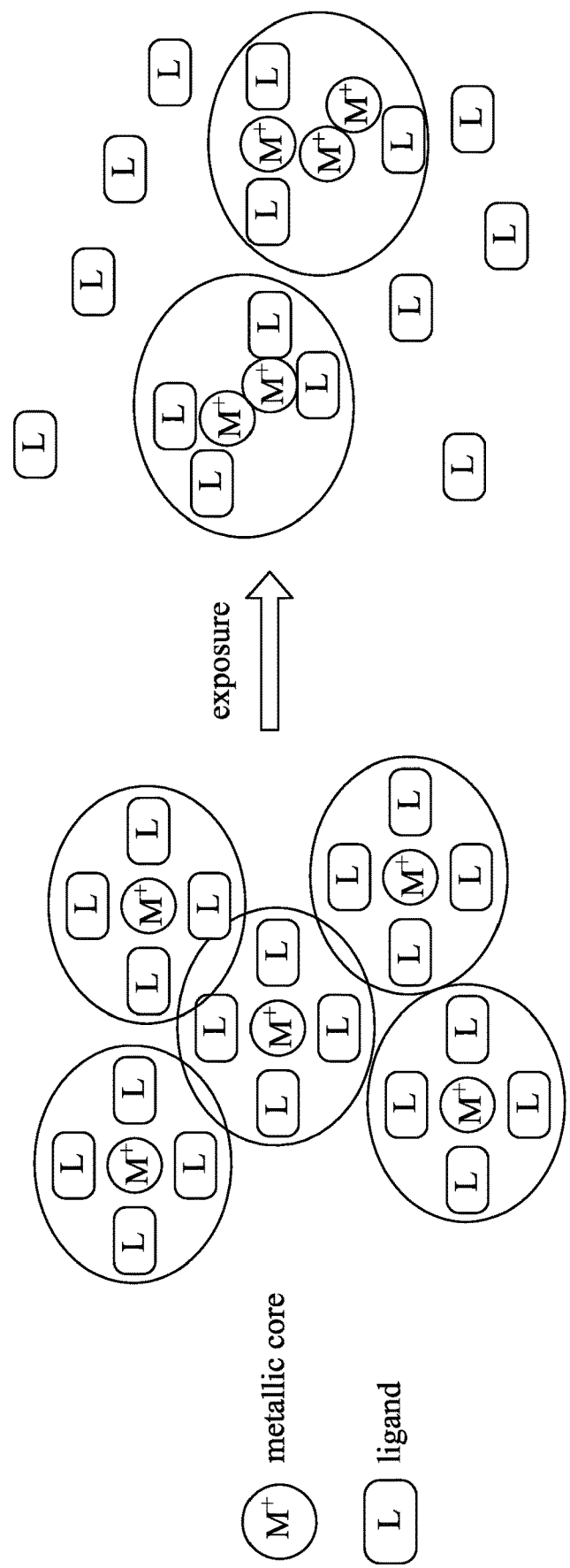

In some embodiments, the first organometallic compound or first organometallic precursor includes a metallic core $M^+$ with ligands L attached to the metallic core $M^+$, as shown in FIG. 9B. In some embodiments, the metallic core $M^+$ is a metal oxide. The ligands L include C3-C12 aliphatic or aromatic groups in some embodiments. The aliphatic or aromatic groups may be unbranched or branched with cyclic, or noncyclic saturated pendant groups containing 1-9 carbons, including alkyl groups, alkenyl groups, and phenyl groups. The branched groups may be further substituted with oxygen or halogen. In some embodiments, the C3-C12 aliphatic or aromatic groups include heterocyclic groups. In some embodiments, the C3-C12 aliphatic or aromatic groups are attached to the metal by an ether or ester linkage. In some embodiments, the C3-C12 aliphatic or aromatic groups include nitrite and sulfonate substituents.

In some embodiments, the organometallic precursor or organometallic compound include a sec-hexyl tris(dimethylamino) tin, t-hexyl tris(dimethylamino) tin, i-hexyl tris(dimethylamino) tin, n-hexyl tris(dimethylamino) tin, sec-pentyl tris(dimethylamino) tin, t-pentyl tris(dimethylamino) tin, i-pentyl tris(dimethylamino) tin, n-pentyl tris(dimethylamino) tin, sec-butyl tris(dimethylamino) tin, t-butyl tris(dimethylamino) tin, i-butyl tris(dimethylamino) tin, n-butyl tris(dimethylamino) tin, sec-butyl tris(dimethylamino) tin, i-propyl(tris)dimethylamino tin, n-propyl tris(diethylamino) tin, and analogous alkyl(tris)(t-butoxy) tin compounds, including sec-hexyl tris(t-butoxy) tin, t-hexyl tris(t-butoxy) tin, i-hexyl tris(t-butoxy) tin, n-hexyl tris(t-butoxy) tin, sec-pentyl tris(t-butoxy) tin, t-pentyl tris(t-butoxy) tin, i-pentyl tris(t-butoxy) tin, n-pentyl tris(t-butoxy) tin, t-butyl tris(t-butoxy) tin, i-butyl tris(butoxy) tin, n-butyl tris(butoxy) tin, sec-butyl tris(butoxy) tin, i-propyl(tris)dimethylamino tin, or n-propyl tris(butoxy) tin. In some embodiments, the organometallic precursors or organometallic compounds are fluorinated. In some embodiments, the organometallic precursors or compounds have a boiling point less than about 200° C.

In some embodiments, the first compound or first precursor includes one or more unsaturated bonds that can be coordinated with a functional group, such as a hydroxyl group, on the surface of the substrate or an intervening underlayer to improve adhesion of the photoresist layer to the substrate or underlayer.

In some embodiments, the second precursor or second compound is at least one of an amine, a borane, a phosphine, or water. In some embodiments, the amine has a formula $N_pH_nX_m$, where $0≤n≤3$, $0≤m≤3$, $n+m=3$ when p is 1, and $n+m=4$ when p is 2, and each X is independently a halogen selected from the group consisting of F, Cl, Br, and I. In some embodiments, the borane has a formula $B_pH_nX_m$, where $0≤n≤3$, $0≤m≤3$, $n+m=3$ when p is 1, and $n+m=4$ when p is 2, and each X is independently a halogen selected from the group consisting of F, Cl, Br, and I. In some embodiments, the phosphine has a formula $P_pH_nX_m$, where $0≤n≤3$, $0≤m≤3$, $n+m=3$, when p is 1, or $n+m=4$ when p is 2, and each X is independently a halogen selected from the group consisting of F, Cl, Br, and I.

In some embodiments, the second precursor or compound is water, ammonia, or hydrazine. The reaction product of the water, ammonia, or hydrazine and the organometallic precursor or compound may form hydrogen bonds that increase the boiling point of the reaction product and prevent emission of the metal photoresist material, thereby preventing metal contamination. The hydrogen bonds can also help prevent moisture effects to the photoresist layer quality.

FIG. 9B shows a reaction metallic precursors undergo as a result of exposure to actinic radiation in some embodiment As a result of exposure to the actinic radiation, ligand groups L are split off from the metallic core $M^+$ of the metallic precursors, and two or more metallic precursor cores bond with each other.

Figure 9C:
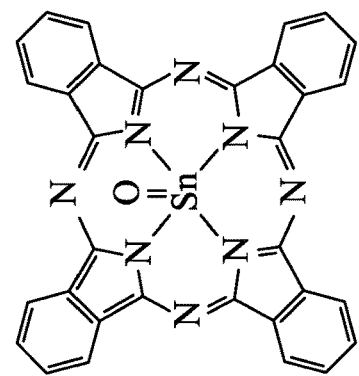
Figure 9C:
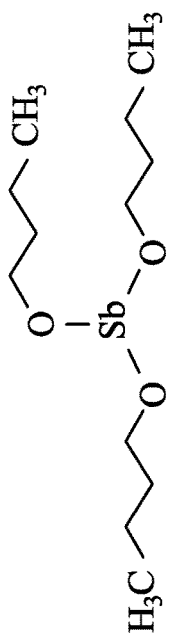
Figure 9C:
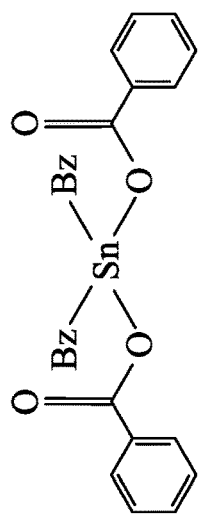
Figure 9C:
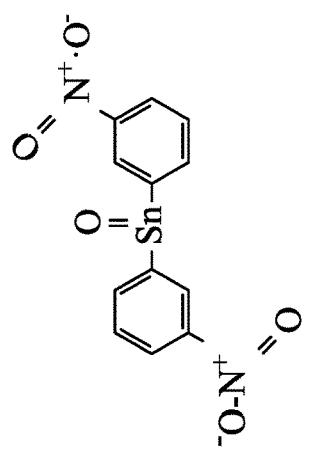
Figure 9C:
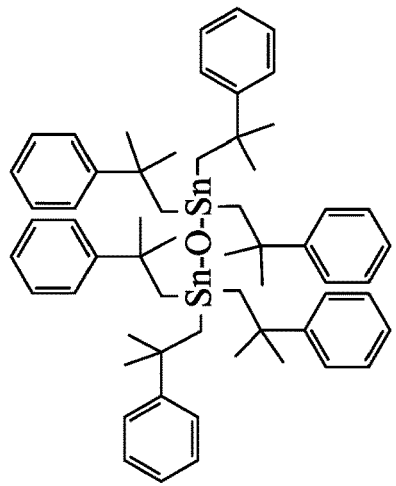
Figure 9C:
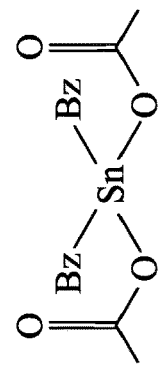

FIG. 9C shows examples of organometallic precursors according to embodiments of the disclosure. In FIG. 9C Bz is a benzene group.

In some embodiments, the operation S110 of depositing a photoresist composition is performed by a vapor phase deposition operation. In some embodiments, the vapor phase deposition operation includes atomic layer deposition (ALD) or chemical vapor deposition (CVD). In some embodiments, the ALD includes plasma-enhanced atomic layer deposition (PE-ALD), and the CVD includes plasma-enhanced chemical vapor deposition (PE-CVD), metal-organic chemical vapor deposition (MO-CVD); atmospheric pressure chemical vapor deposition (AP-CVD), and low pressure chemical vapor deposition (LP-CVD).

Figure 10:
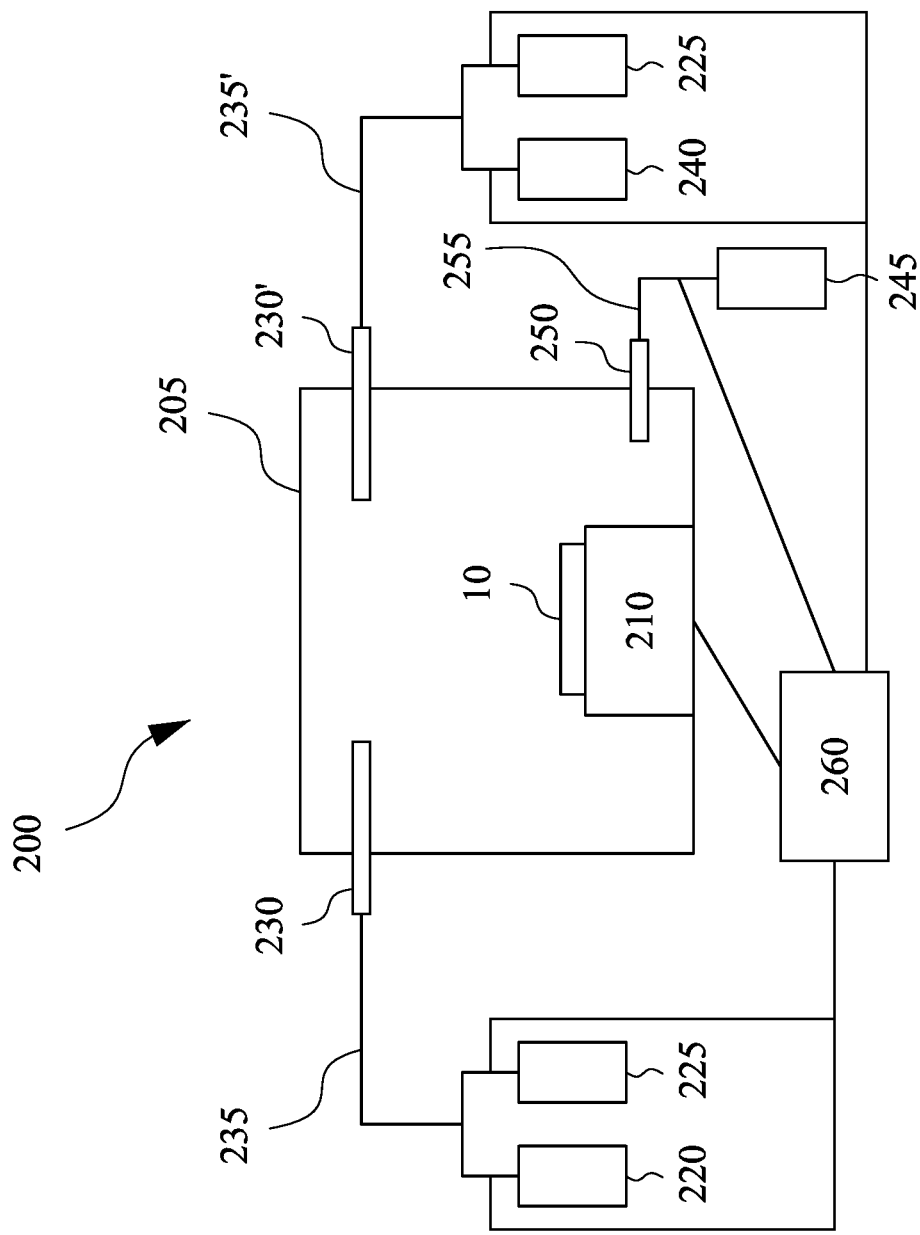
FIG. 10 shows a photoresist deposition apparatus according to some embodiments of the disclosure.

A resist layer deposition apparatus 200 according to some embodiments of the disclosure is shown in FIG. 10. In some embodiments, the deposition apparatus 200 is an ALD or CVD apparatus. The deposition apparatus 200 includes a vacuum chamber 205. A substrate support stage 210 in the vacuum chamber 205 supports a substrate 10, such as silicon wafer. In some embodiments, the substrate support stage 210 includes a heater. A first precursor or compound gas supply 220 and carrier/purge gas supply 225 are connected to an inlet 230 in the chamber via a gas line 235, and a second precursor or compound gas supply 240 and carrier/purge gas supply 225 are connected to another inlet 230' in the chamber via another gas line 235' in some embodiments. The chamber is evacuated, and excess reactants and reaction byproducts are removed by a vacuum pump 245 via an outlet 250 and exhaust line 255. In some embodiments, the flow rate or pulses of precursor gases and carrier/purge gases, evacuation of excess reactants and reaction byproducts, pressure inside the vacuum chamber 205, and temperature of the vacuum chamber 205 or wafer support stage 210 are controlled by a controller 260 configured to control each of these parameters.

Depositing a photoresist layer includes combining the first compound or first precursor and the second compound or second precursor in a vapor state to form the photoresist composition. In some embodiments, the first compound or first precursor and the second compound or second precursor of the photoresist composition are introduced into the deposition chamber 205 (CVD chamber) at about the same time via the inlets 230, 230'. In some embodiments, the first compound or first precursor and second compound or second precursor are introduced into the deposition chamber 205 (ALD chamber) in an alternating manner via the inlets 230, 230', i.e.—first one compound or precursor then a second compound or precursor, and then subsequently alternately repeating the introduction of the one compound or precursor followed by the second compound or precursor.

In some embodiments, the deposition chamber temperature ranges from about 30° C. to about 400° C. during the deposition operation, and between about 50° C. to about 250° C. in other embodiments. In some embodiments, pressure in the deposition chamber ranges from about 5 mTorr to about 100 Torr during the deposition operation, and between about 100 mTorr to about 10 Torr in other embodiments. In some embodiments, the plasma power is less than about 1000 W. In some embodiments, the plasma power ranges from about 100 W to about 900 W. In some embodiments, the flow rate of the first compound or precursor and the second compound or precursor ranges from about 100 sccm to about 1000 sccm. In some embodiments, the ratio of the flow of the organometallic compound or precursor to the second compound or precursor ranges from about 1:1 to about 1:5. At operating parameters outside the above-recited ranges, unsatisfactory photoresist layers result in some embodiments. In some embodiments, the photoresist layer formation occurs in a single chamber (a one-pot layer formation).

In a CVD process according to some embodiments of the disclosure, two or more gas streams, in separate inlet paths 230, 235 and 230', 235', of an organometallic precursor and a second precursor are introduced to the deposition chamber 205 of a CVD apparatus, where they mix and react in the gas phase, to form a reaction product. The streams are introduced using separate injection inlets 230, 230' or a dualplenum showerhead in some embodiments. The deposition apparatus is configured so that the streams of organometallic precursor and second precursor are mixed in the chamber, allowing the organometallic precursor and second precursor to react to form a reaction product. Without limiting the mechanism, function, or utility of the disclosure, it is believed that the product from the vapor-phase reaction becomes heavier in molecular weight, and is then condensed or otherwise deposited onto the substrate 10.

In some embodiments, an ALD process is used to deposit the photoresist layer. During ALD, a layer is grown on a substrate 10 by exposing the surface of the substrate to alternate gaseous compounds (or precursors). In contrast to CVD, the precursors are introduced as a series of sequential, non-overlapping pulses. In each of these pulses the precursor molecules react with the surface in a self-limiting way, so that the reaction terminates once all the reactive sites on the surface are consumed. Consequently, the maximum amount of material deposited on the surface after a single exposure to all of the precursors (a so-called ALD cycle) is determined by the nature of the precursor-surface interaction.

In an embodiment of an ALD process, an organometallic precursor is pulsed to deliver the metal-containing precursor to the substrate 10 surface in a first half reaction. In some embodiments, the organometallic precursor reacts with a suitable underlying species (for example OH or NH functionality on the surface of the substrate) to form a new self-saturating surface. Excess unused reactants and the reaction by-products are removed, by an evacuation-pump down using a vacuum pump 245 and/or by a flowing an inert purge gas in some embodiments. Then, a second precursor, such as ammonia ($NH_3$), is pulsed to the deposition chamber in some embodiments. The $NH_3$ reacts with the organometallic precursor on the substrate to obtain a reaction product photoresist on the substrate surface. The second precursor also forms self-saturating bonds with the underlying reactive species to provide another self-limiting and saturating second half reaction. A second purge is performed to remove unused reactants and the reaction by-products in some embodiments. Pulses of the first precursor and second precursor are alternated with intervening purge operations until a desired thickness of the photoresist layer is achieved.

In some embodiments, the photoresist layer 15 is formed to a thickness of about 5 nm to about 50 nm, and to a thickness of about 10 nm to about 30 nm in other embodiments. A person of ordinary skill in the art will recognize that additional ranges of thicknesses within the explicit ranges above are contemplated and are within the present disclosure. The thickness can be evaluated using non-contact methods of x-ray reflectivity and/or ellipsometry based on the optical properties of the photoresist layers. In some embodiments, each photoresist layer thickness is relatively uniform to facilitate processing. In some embodiments, the variation in thickness of the deposited photoresist layer varies by no more than ±25% from the average thickness, in other embodiments each photoresist layer thickness varies by no more than ±10% from the average photoresist layer thickness. In some embodiments, such as high uniformity depositions on larger substrates, the evaluation of the photoresist layer uniformity may be evaluated with a 1 centimeter edge exclusion, i.e., the layer uniformity is not evaluated for portions of the coating within 1 centimeter of the edge. A person of ordinary skill in the art will recognize that additional ranges within the explicit ranges above are contemplated and are within the present disclosure.

In some embodiments, the first and second compounds or precursors are delivered into the deposition chamber 205 with a carrier gas. The carrier gas, a purge gas, a deposition gas, or other process gas may contain nitrogen, hydrogen, argon, neon, helium, or combinations thereof.

In some embodiments, the organometallic compound includes tin (Sn), antimony (Sb), bismuth (Bi), indium (In), and/or tellurium (Te) as the metal component, however, the disclosure is not limited to these metals. In other embodiments, additional suitable metals include titanium (Ti), zirconium (Zr), hafnium (Hf), vanadium (V), cobalt (Co), molybdenum (Mo), tungsten (W), aluminum (Al), gallium (Ga), silicon (Si), germanium (Ge), phosphorus (P), arsenic (As), yttrium (Y), lanthanum (La), cerium (Ce), lutetium (Lu), or combinations thereof. The additional metals can be as alternatives to or in addition to the Sn, Sb, Bi, In, and/or Te.

The particular metal used may significantly influence the absorption of radiation. Therefore, the metal component can be selected based on the desired radiation and absorption cross section. Tin, antimony, bismuth, tellurium, and indium provide strong absorption of extreme ultraviolet light at 13.5 nm. Hafnium provides good absorption of electron beam and extreme UV radiation. Metal compositions including titanium, vanadium, molybdenum, or tungsten have strong absorption at longer wavelengths, to provide, for example, sensitivity to 248 nm wavelength ultraviolet light.

Figure 11:
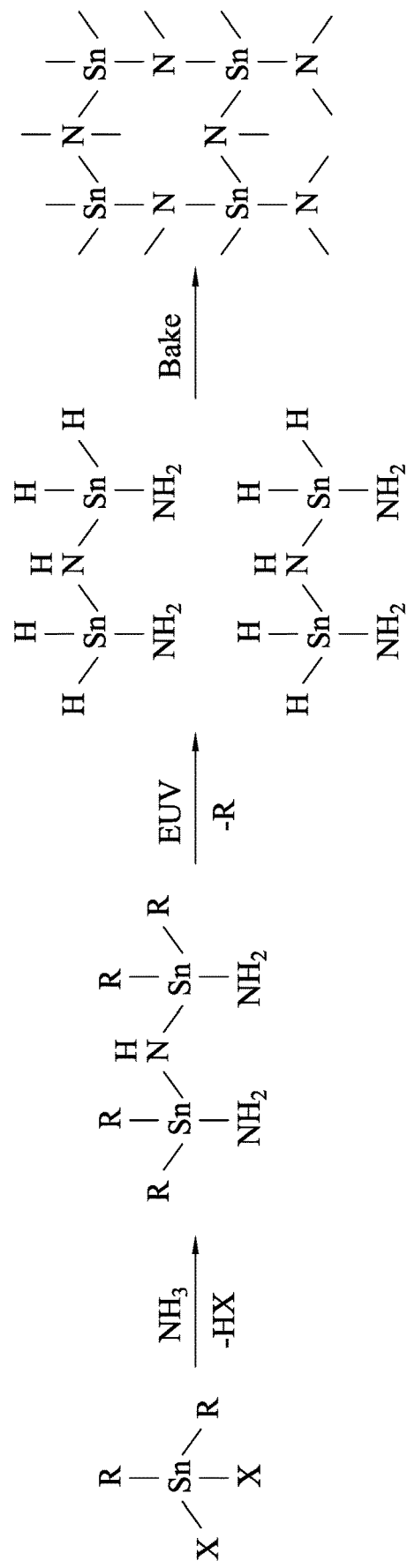
FIG. 11 shows a reaction the photoresist layer undergoes as a result of exposure to actinic radiation and heating according to an embodiment of the disclosure.

FIG. 11 shows a reaction the photoresist composition components undergo as a result of exposure to actinic radiation and heating according to an embodiment of the disclosure. FIG. 11 shows an exemplary chemical structure of the photoresist layer (PR) at various stages of the photoresist patterning method according to embodiments of the disclosure. As shown in FIG. 11, the photoresist composition includes an organometallic compound, for example $SnX_2R_2$, and a second compound, for example ammonia ($NH_3$). When the organometallic compound and the ammonia are combined, the organometallic compound reacts with some of the ammonia in the vapor phase to form a reaction product with amine groups attached to the metal (Sn) of the organometallic compound. The amine groups in the as deposited photoresist layer have hydrogen bonds that can substantially increase the boiling point of the deposited photoresist layer and prevent the outgas sing of metal-containing photoresist material, thereby preventing contamination of the deposition chamber and semiconductor device processing equipment by the metal in the metal-containing photoresist. Moreover, the hydrogen bonds of the amine groups can control the effect moisture has on photoresist layer quality.

When subsequently exposed to extreme ultraviolet radiation, the organometallic compound absorbs the extreme ultraviolet radiation and one or more organic R groups are cleaved from the organometallic compound to form an amino metallic compound in the radiation exposed areas. Then, when the post-exposure bake (PEB) performed, the amino metallic compounds crosslink through the amine groups in some embodiments, as shown in FIG. 11. In some embodiments, partial crosslinking of the amino metallic compounds occurs as a result of the exposure to extreme ultraviolet radiation.

In some embodiments, the protective layer 20 includes a polymer. In some embodiments, the polymer is at least one of a polyvinyl alcohol, a polyacrylic acid, a polymethylmethacrylate, a polyacrylamide, a polytetrafluoroethylene, a polyethylene, a polypropylene, a polystyrene, a polyhydroxystyrene, or a polymethylacrylic acid. In some embodiments, the polymer has a molecular weight ranging from about 1000 daltons to about 10,000 daltons. In some embodiments, the polymer has a molecular weight ranging from about 2,000 daltons to about 8,000 daltons. Polymers having molecular weights less than about 1000 daltons may not sufficiently inhibit metal-containing resist outgassing. Polymers having molecular weights greater than about 10,000 daltons may be difficult to subsequently completely remove and result in decreased resist pattern resolution. In some embodiments, the thickness of the protective layer 20 ranges from about 3 nm to about 100 nm. In some embodiments, the protective layer has a thickness ranging from about 15 nm to about 80 nm. At thicknesses below about 3 nm, the protective layer may not sufficiently inhibit metal-containing resist outgassing. At thicknesses greater than about 100 nm, it may be difficult to subsequently completely remove the protective layer resulting in decreased resist pattern resolution.

In some embodiments, forming the protective layer 20 includes: combining a polymer and a solvent to form a protective layer composition, depositing the protective layer composition over the resist layer 15, and removing the solvent from the protective layer composition. In some embodiments, depositing the protective layer composition includes spin coating the protective layer composition over the resist layer 15. In some embodiments, removing the solvent from the protective layer composition includes heating the protective layer 20 at a temperature ranging from about 40° C. and about 150° C. for about 10 seconds to about 10 minutes.

In some embodiments, the solvent is at least one of an ether, including propylene glycol methyl ether acetate (PGMEA), propylene glycol monomethyl ether (PGME), diethyl ether, diisoamyl ether (DIAE), and 1-ethoxy-2-propanol (PGEE); γ-butyrolactone (GBL); cyclohexanone (CHN); ethyl lactate (EL); an alcohol, including methanol, ethanol, propanol, isopropanol (IPA), n-butanol, 4-methyl-2-pentanol; a ketone, including acetone, methyl ethyl ketone, and 2-heptanone (MAK); dimethylformamide (DMF); tetrahydrofuran (THF); methyl isobutyl carbinol (MIBC); n-butyl acetate (nBA); tetrahydrofuran (THF); 1,4-dioxane; an alkane; and deionized water. In some embodiments, the polymer is dissolved in the solvent, and the underlying resist layer is not soluble in the solvent.

In some embodiments, the protective layer 20 is not a photoresist layer. In some embodiments, the portion of the protective layer 20 that is selectively exposed to the actinic radiation does not undergo a crosslinking reaction. In some embodiments, the composition of the protective layer is not photosensitive to the actinic radiation used to selectively expose the resist layer 15. In some embodiments, the protective layer 20 does not affect the actinic radiation absorption of the resist layer 15.

In some embodiments, the solvent is a polar solvent, including at least one of deionized water, an alcohol, or a ketone. In some embodiments, the polar solvent includes at least one of IPA, PGME, DMSO, or water. In some embodiments, the protective layer 20 composition includes a polar solvent and the polymer is a hydrophilic polymer. In some embodiments, the hydrophilic polymer is at least one of a polyvinyl alcohol, a polyacrylic acid, a polymethylacrylic acid, a polyacrylamide, or a polyhydroxystyrene. They hydrophilic polymer provides a protective layer having a hydrophilic top surface. The hydrophilic polymer may have improved solubility in the solvent used for removing the protective layer, and enable improved resolution of the resist layer. In some embodiments, the hydrophilic polymer protective layer improves the development operation of the resist layer 15 and thereby improves the pattern resolution.

In some embodiments, the solvent is a non-polar solvent, including at least one of an ether, such as diethyl ether or DIAE; an alkane; or 1,4-dioxane and the polymer is a hydrophobic polymer. In some embodiments, the hydrophobic polymer is at least one of a polytetrafluoroethylene, a polyethylene, a polypropylene, or a polystyrene. In some embodiments, the hydrophobic polymer provides a hydrophobic surface that prevents moisture in the environment from entering the resist layer and degrading resist layer performance. Absorption of moisture by the resist layer 15 can cause excessive crosslinking to occur the resist layer 15, including in unexposed portions of the resist layer where crosslinking may be undesirable. Therefore, in some embodiments, the hydrophobic surface improves the pattern resolution.

The protective layer 20 is removed by any of the solvents disclosed herein. In other embodiments, the protective layer is removed by ultraviolet irradiation, thermal treatment, etching, or the resist developer.

Figure 12:
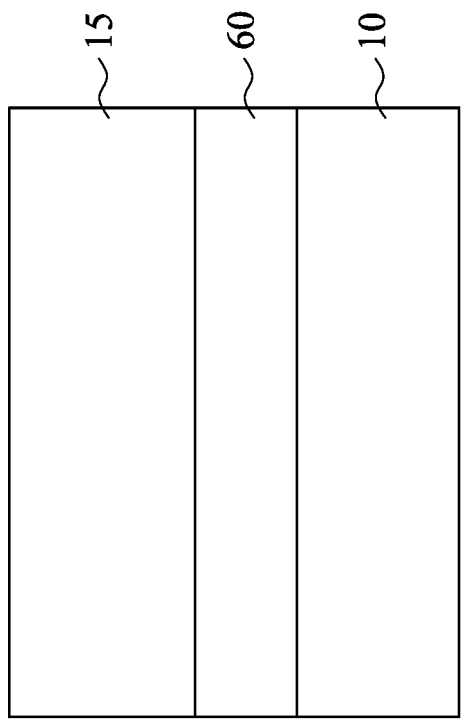
FIG. 12 shows a process stage of a sequential operation according to an embodiment of the disclosure.

In some embodiments, a layer to be patterned (target layer) 60 is disposed over the substrate prior to forming the photoresist layer, as shown in FIG. 12. In some embodiments, the layer to be patterned 60 is a metallization layer or a dielectric layer, such as a passivation layer, disposed over a metallization layer. In embodiments where the layer to be patterned 60 is a metallization layer, the layer to be patterned 60 is formed of a conductive material using metallization processes, and metal deposition techniques, including chemical vapor deposition, atomic layer deposition, and physical vapor deposition (sputtering). Likewise, if the layer to be patterned 60 is a dielectric layer, the layer to be patterned 60 is formed by dielectric layer formation techniques, including thermal oxidation, chemical vapor deposition, atomic layer deposition, and physical vapor deposition.

Figure 13:
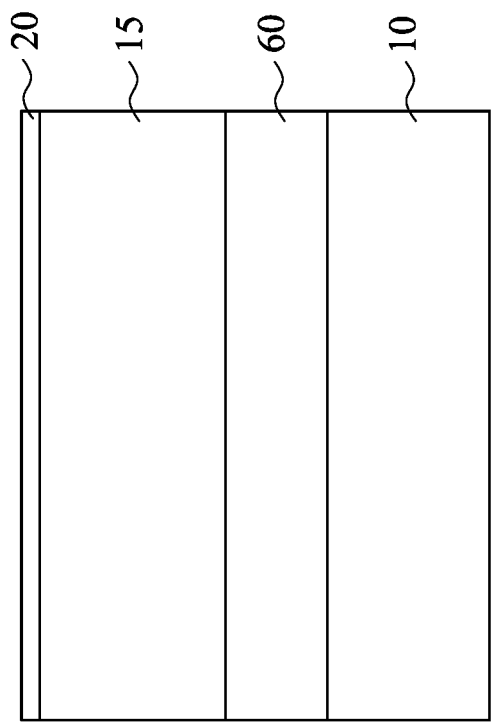
FIG. 13 shows a process stage of a sequential operation according to an embodiment of the disclosure.

In some embodiments, the resist layer 15 then undergoes an optional first heating operation at a temperature of between about 40° C. and about 150° C. for about 10 seconds to about 10 minutes. After the optional first heating operation or the resist layer formation, a protective layer 20 is formed over the resist layer 15, as shown in FIG. 13. The protective layer 20 is the same as the protective layer described in reference to FIG. 3. In some embodiments, the protective layer 20 is subsequently heated in a second heating operation to remove solvents or dry the protective layer at a temperature of between about 40° C. and about 150° C. for about 10 seconds to about 10 minutes.

Figure 14A:
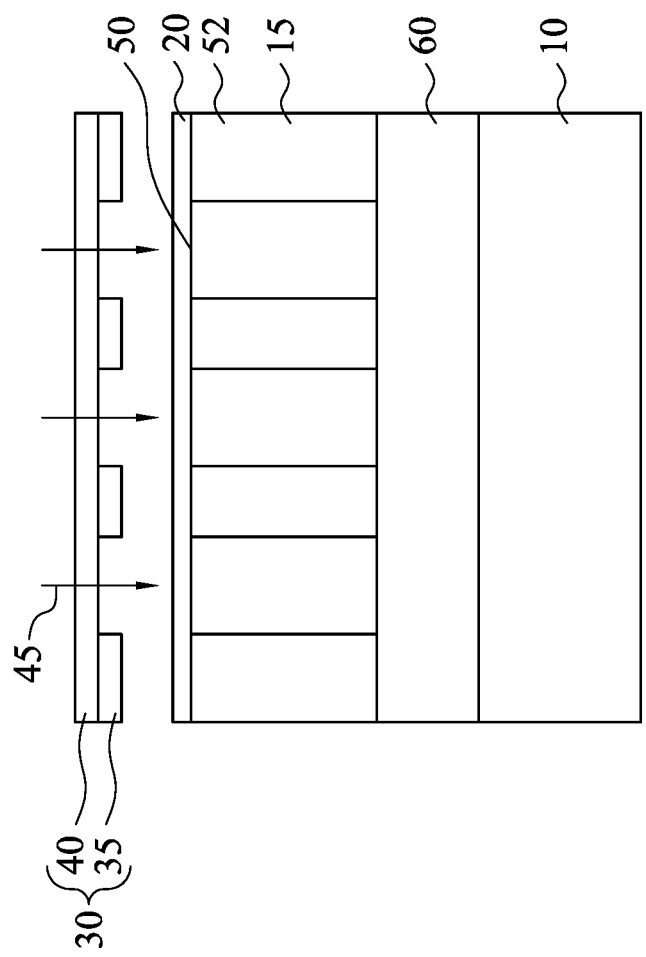
FIGS. 14A and 14B show a process stage of a sequential operation according to an embodiment of the disclosure.
Figure 14B:
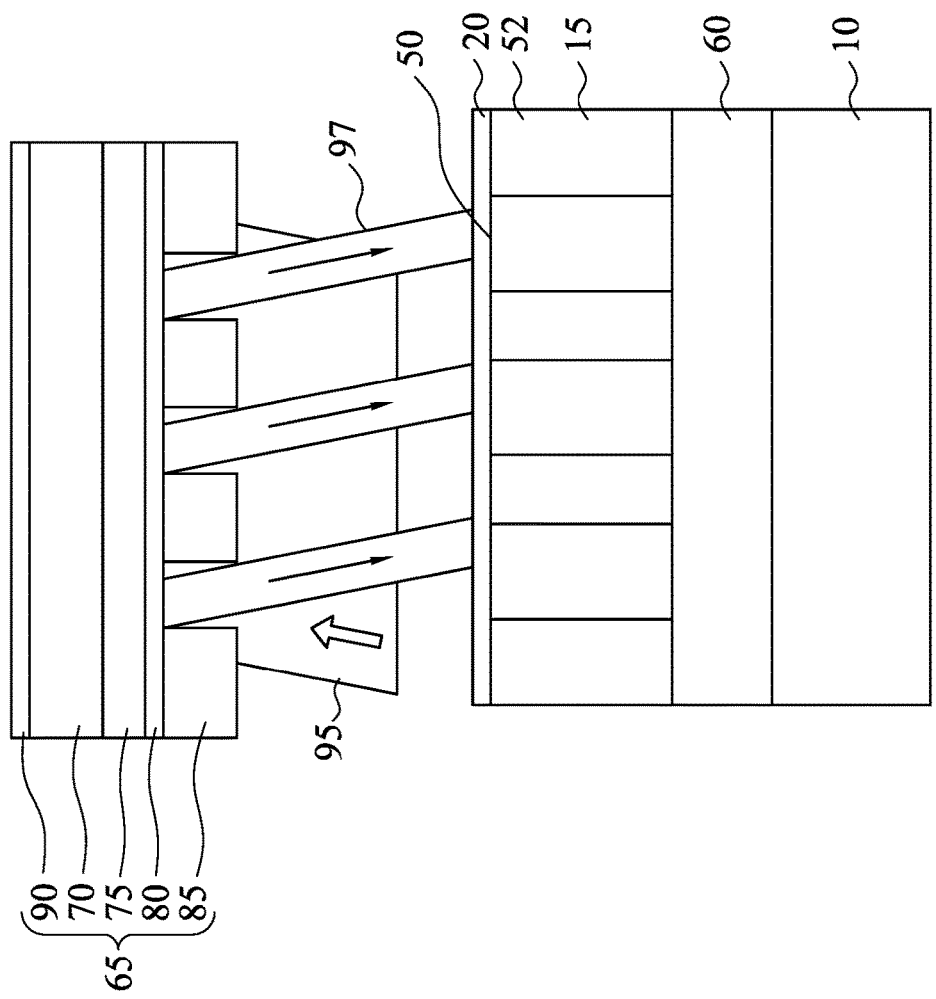

The photoresist layer 15 and the protective layer 20 are subsequently selectively exposed to actinic radiation 45 to form exposed regions 50 and unexposed regions 52 in the photoresist layer, as shown in FIGS. 14A and 14B, and described herein in relation to FIGS. 4A and 4B. As explained herein the photoresist is a negative-tone photoresist in some embodiments.

Next, the resist layer 15 and the protective layer 20 undergo a third heating or a post-exposure bake (PEB). In some embodiments, the resist layer 15 and the protective layer 20 is heated to a temperature of about 50° C. to about 250° C. for about 20 seconds to about 300 seconds. In some embodiments, the post-exposure baking is performed at a temperature ranging from about 100° C. to about 230° C., and at a temperature ranging from about 150° C. to about 200° C. in other embodiments.

Figure 15:
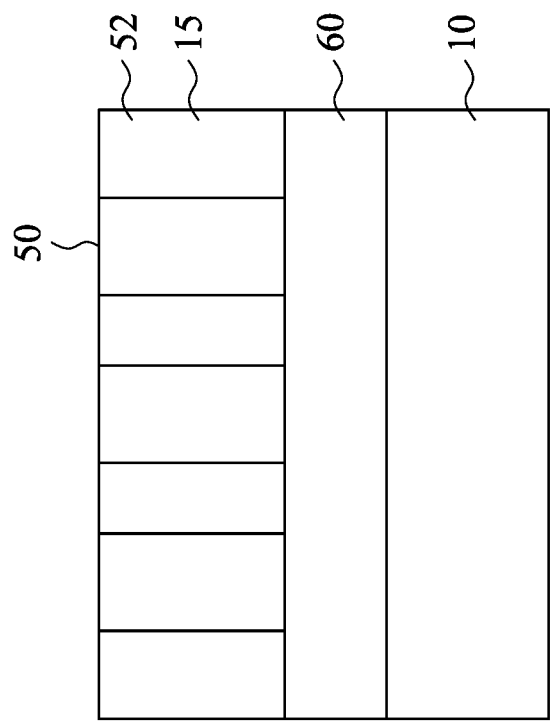
FIG. 15 shows a process stage of a sequential operation according to an embodiment of the disclosure.

In some embodiments, the protective layer 20 is subsequently removed, as shown in FIG. 15, after the post-exposure bake operation.

Figure 16B:
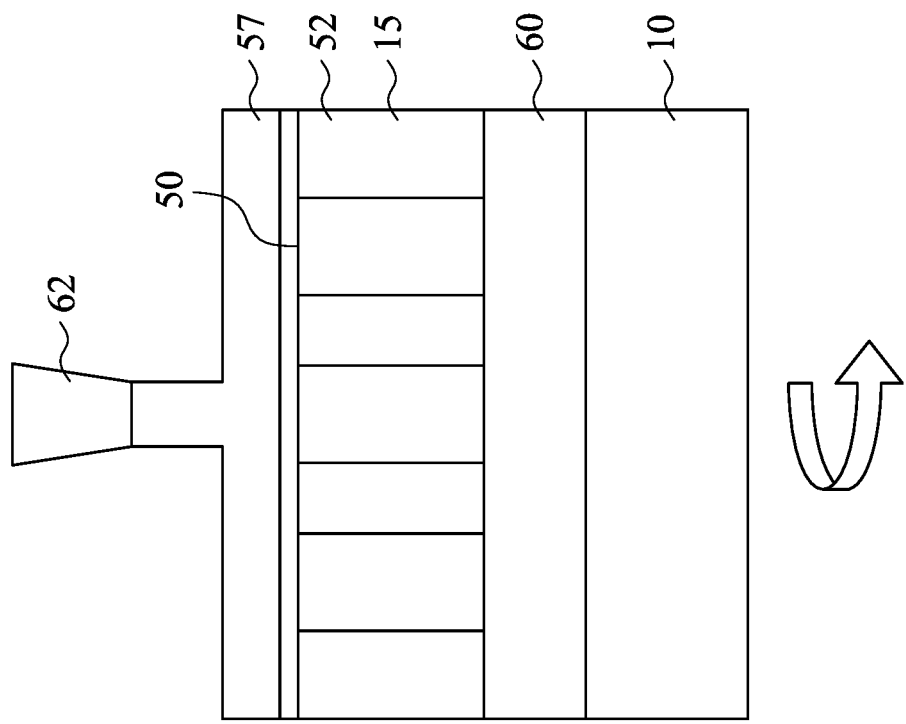
Figure 16C:
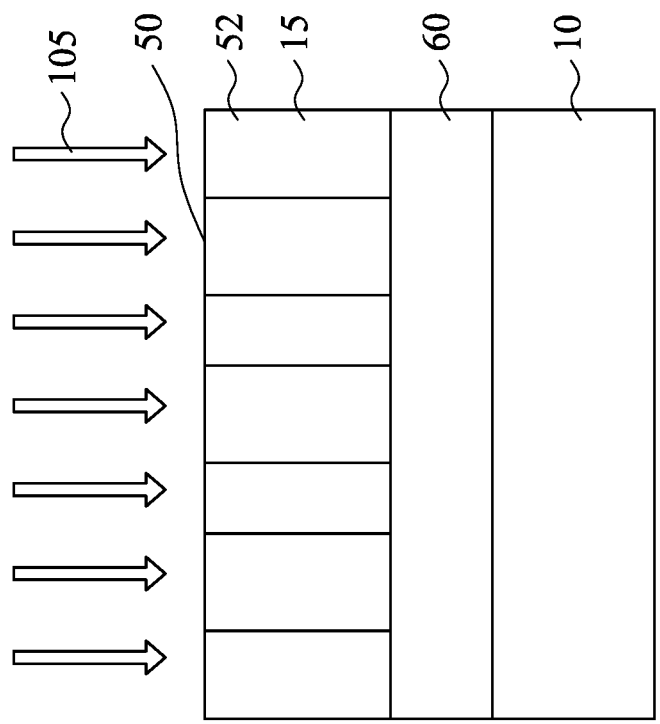
Figure 17:
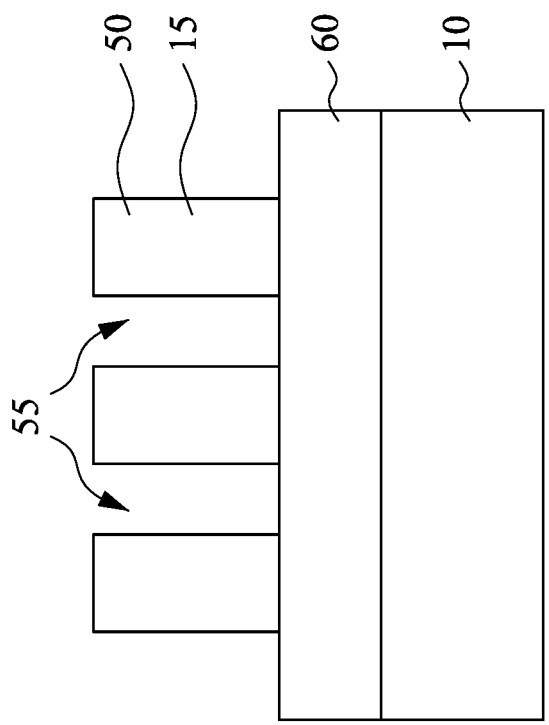
FIG. 17 shows a process stage of a sequential operation according to an embodiment of the disclosure.

The unexposed photoresist regions 52 are developed by dispensing developer 57 from a dispenser 62, as shown in FIG. 16A. In some embodiments, the protective layer 20 is removed during the development operation, as shown in FIG. 16B. In other embodiments, the unexposed photoresist regions are developed by a dry development operation, as shown in FIG. 16C. The development operation forms a photoresist pattern 55, as shown in FIG. 17. The development operation is similar to that explained herein with reference to FIGS. 6A, 6B, 6C, and 7.

Figure 18:
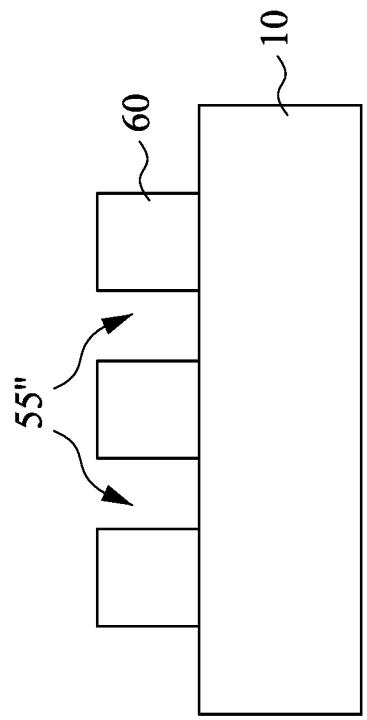
FIG. 18 shows a process stage of a sequential operation according to an embodiment of the disclosure.

Then as shown in FIG. 18, the pattern 55 in the photoresist layer 15 is transferred to the layer to be patterned 60 using an etching operation and the photoresist layer is removed, as explained with reference to FIG. 8 to form pattern 55" in the layer to be patterned 60.

Other embodiments include other operations before, during, or after the operations described above. In some embodiments, the disclosed methods include forming fin field effect transistor (FinFET) structures. In some embodiments, a plurality of active fins are formed on the semiconductor substrate. Such embodiments, further include etching the substrate through the openings of a patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In some embodiments, one or more gate electrodes are formed on the substrate. Some embodiments include forming gate spacers, doped source/drain regions, contacts for gate/source/drain features, etc. In other embodiments, a target pattern is formed as metal lines in a multilayer interconnection structure. For example, the metal lines may be formed in an inter-layer dielectric (ILD) layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer. The above are non-limiting examples of devices/structures that can be made and/or improved using the method described herein.

In some embodiments, active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, FinFETs, other three-dimensional (3D) FETs, other memory cells, and combinations thereof are formed, according to embodiments of the disclosure.

Embodiments of the disclosure provide a uniform photoresist film deposited on the surface of a semiconductor substrate. In some embodiments, contamination of the deposition chamber and semiconductor substrate handling equipment from metals in metal-containing photoresists is prevented. Photoresist moisture sensitivity issues are prevented by methods according to embodiments of the disclosure. Improved pattern resolution is provided by embodiments of the present disclosure. Embodiments of the disclosure provide improved line width roughness.

An embodiment of the disclosure is a method of manufacturing a semiconductor device, including forming a photoresist layer over a substrate, including combining a first precursor and a second precursor in a vapor state to form a photoresist material, and depositing the photoresist material over the substrate. A protective layer is formed over the photoresist layer. The photoresist layer is selectively exposed to actinic radiation through the protective layer to form a latent pattern in the photoresist layer. The protective layer is removed, and the latent pattern is developed by applying a developer to the selectively exposed photoresist layer to form a pattern. In an embodiment, the protective layer includes a hydrophilic polymer. In an embodiment, the protective layer includes a hydrophobic polymer. In an embodiment, the protective layer includes a polymer selected from the group consisting of a polyvinyl alcohol, a polyacrylic acid, a polymethylmethacrylate, a polyacrylamide, a polytetrafluoroethylene, a polyethylene, a polypropylene, a polystyrene, a polyhydroxystyrene, a polymethylacrylic acid, and combinations thereof. In an embodiment, the protective layer includes a polymer. In an embodiment, the polymer has a molecular weight ranging from 1000 daltons to 10,000 daltons. In an embodiment, the forming a protective layer over the photoresist layer includes spin coating a mixture of the polymer and a solvent over the substrate. In an embodiment, the first precursor is an organometallic having a formula: $M_aR_bX_c$, where M is at least one of Sn, Bi, Sb, In, Te, Ti, Zr, Hf, V, Co, Mo, W, Al, Ga, Si, Ge, P, As, Y, La, Ce, or Lu; R is a substituted or unsubstituted alkyl, alkenyl, or carboxylate group; X is a halide or sulfonate group; and $1 \leq a \leq 2$, $b \geq 1$, $c \geq 1$, and $b+c \leq 5$; and the second precursor is at least one of an amine, a borane, a phosphine, or water. In an embodiment, the method includes, after selectively exposing the photoresist layer to actinic radiation to form a latent pattern and before removing the protective layer, heating the photoresist layer. In an embodiment, the method includes after forming the protective layer over the photoresist layer and before selectively exposing the photoresist layer to actinic radiation, heating the photoresist layer. In an embodiment, the protective layer is removed during the developing the latent pattern. In an embodiment, the photoresist material is deposited over the substrate by atomic layer deposition (ALD) or chemical vapor deposition (CVD).

Another embodiment of the disclosure is a method of manufacturing a semiconductor device, including depositing a photoresist composition including a first organometallic compound and a second compound over a substrate surface via atomic layer deposition (ALD) or chemical vapor deposition (CVD) to form a photoresist layer. A protective layer including a polymer is formed over the photoresist layer. The photoresist layer is selectively exposed to actinic radiation through the protective layer to form a latent pattern. The protective layer is removed, and the latent pattern is developed by applying a developer to the selectively exposed photoresist layer to form a pattern exposing a portion of the substrate surface. A portion of the substrate surface exposed by the developing is removed. In an embodiment, the first organometallic compound is at least one of a sec-hexyl tris(dimethylamino) tin, t-hexyl tris(dimethylamino) tin, i-hexyl tris(dimethylamino) tin, n-hexyl tris(dimethylamino) tin, sec-pentyl tris(dimethylamino) tin, t-pentyl tris(dimethylamino) tin, i-pentyl tris(dimethylamino) tin, n-pentyl tris (dimethylamino) tin, sec-butyl tris(dimethylamino) tin, t-butyl tris(dimethylamino) tin, i-butyl tris(dimethylamino) tin, n-butyl tris(dimethylamino) tin, sec-butyl tris(dimethylamino) tin, i-propyl(tris)dimethylamino tin, n-propyl tris (diethylamino) tin, and analogous alkyl(tris)(t-butoxy) tin compounds, including sec-hexyl tris(t-butoxy) tin, t-hexyl tris(t-butoxy) tin, i-hexyl tris(t-butoxy) tin, n-hexyl tris(t-butoxy) tin, sec-pentyl tris(t-butoxy) tin, t-pentyl tris(t- butoxy) tin, i-pentyl tris(t-butoxy) tin, n-pentyl tris(t-butoxy) tin, t-butyl tris(t-butoxy) tin, i-butyl tris(butoxy) tin, n-butyl tris(butoxy) tin, sec-butyl tris(butoxy) tin, i-propyl (tris)dimethylamino tin, or n-propyl tris(butoxy) tin; and the second compound is at least one of an amine, a borane, a phosphine, or water. In an embodiment, the removing a portion of the substrate surface by the developing includes etching the substrate surface. In an embodiment, the method includes after selectively exposing the photoresist layer through the protective layer to actinic radiation to form a latent pattern and before removing the protective layer, heating the photoresist layer at a temperature ranging from 100° C. to 200° C. In an embodiment, the polymer is at least one of hydrophilic polymer or a hydrophobic polymer. In an embodiment, the polymer is at least one of a polyvinyl alcohol, a polyacrylic acid, a polymethylmethacrylate, a polyacrylamide, a polytetrafluoroethylene, a polyethylene, a polypropylene, a polystyrene, a polyhydroxystyrene, or a polymethylacrylic acid. In an embodiment, the developer is a dry developer. In an embodiment, the method includes after forming the protective layer over the photoresist layer and before selectively exposing the photoresist layer through the protective layer to actinic radiation, heating the protective layer and photoresist layer at a temperature ranging from 40° C. to 150° C. In an embodiment, the protective layer includes: mixing the polymer and a solvent to form a protective layer composition, spin coating the protective layer composition over the photoresist layer, and removing the solvent from the protective layer composition. In an embodiment, the actinic radiation is extreme ultraviolet radiation. In an embodiment, the method includes heating the photoresist layer before forming the protective layer.

Another embodiment of the disclosure is a method of manufacturing a semiconductor device, including introducing a first compound and a second compound into a chamber at a same time to form a composition of the first compound and the second compound. The composition of the first compound and the second compound is deposited over a substrate via chemical vapor deposition (CVD) to form a layer of the composition of the first compound and the second compound. The first compound is an organometallic compound and the second compound is at least one of an amine, a borane, a phosphine, or water. A protective layer is formed by coating a protective layer composition including a polymer and a solvent over the layer of the composition of the first compound and the second compound. The layer of the composition of the first compound and the second compound is patternwise exposed to actinic radiation through the protective layer to form a latent pattern in the layer of the composition of the first compound and the second compound. The protective layer is removed, and the patternwise exposed layer of the composition is developed to form a patterned layer of the composition of the first compound and the second compound. In an embodiment, the protective layer composition is not photosensitive to the actinic radiation. In an embodiment, after selectively exposing the layer of the composition of the first compound and the second compound through the protective layer to actinic radiation to form a latent pattern and before removing the protective layer, heating the layer of the composition of the first compound and the second compound at a temperature ranging from 100° C. to 200° C. In an embodiment, the solvent is a polar solvent and the polymer is hydrophilic polymer. In an embodiment, the solvent is a non-polar solvent and the polymer is a hydrophobic polymer. In an embodiment, the solvent is a polar solvent and the polymer is at least one of a polyvinyl alcohol, a polyacrylic acid, a polymethylacrylic acid, a polyacrylamide, or a polyhydroxystyrene. In an embodiment, the solvent is a non-polar solvent and the polymer is at least one of a polytetrafluoroethylene, a polyethylene, a polypropylene, or a polystyrene. In an embodiment, the actinic radiation is extreme ultraviolet radiation. In an embodiment, the method includes heating the layer of the composition of the first compound and the second compound before forming the protective layer. In an embodiment, the method includes removing a portion of the substrate exposed by the developing. In an embodiment, the removing a portion of the substrate by the developing includes etching the substrate. In an embodiment, the developing is a dry developing operation.

Another embodiment of the disclosure is a method of patterning a resist layer including depositing a resist layer over a substrate surface by atomic layer deposition (ALD) or chemical vapor deposition (CVD). The resist layer includes a reaction product of an organometallic compound and at least one of an amine, a borane, a phosphine, and water. A protective layer is formed over the resist layer. After forming the protective layer, the resist layer is patternwise crosslinked to form a latent pattern in the resist layer. The protective layer is removed, and the latent pattern is developed by applying a developer to the patternwise crosslinked resist layer to form a pattern exposing a portion of the substrate surface. In an embodiment, the method includes removing an exposed portion of the substrate surface after the developing. In an embodiment, the organometallic compound includes a metal selected from the group consisting of Sn, Bi, Sb, In, and Te. In an embodiment, the protective layer is not crosslinked during the patternwise crosslinking the resist layer. In an embodiment, forming the protective layer includes: combining a polymer and a solvent to form a protective layer composition, spin coating the protective layer composition over the resist layer, and removing the solvent from the protective layer composition. In an embodiment, the solvent is a polar solvent and the polymer is at least one of a polyvinyl alcohol, a polyacrylic acid, a polymethylacrylic acid, a polyacrylamide, or a polyhydroxystyrene. In an embodiment, the solvent is a non-polar solvent and the polymer is at least one of a polytetrafluoroethylene, a polyethylene, a polypropylene, or a polystyrene. In an embodiment, the amine, borane, or phosphine includes a halide substituent. In an embodiment, the patternwise crosslinking the resist layer includes patternwise exposing the resist layer to extreme ultraviolet radiation, and heating the patternwise exposed resist layer and the protective layer. In an embodiment, the patternwise exposed resist layer is heated at a temperature ranging from 100° C. to 200° C.

Another embodiment of the disclosure is a method of forming a patterned layer over a substrate surface, including depositing a reaction product of a vapor phase organometallic compound and a second vapor phase compound over a substrate to form a resist layer over the substrate surface. The organometallic compound has a formula: $M_aR_bX_c$, where M is at least one of Sn, Bi, Sb, In, Te, Ti, Zr, Hf, V, Co, Mo, W, Al, Ga, Si, Ge, P, As, Y, La, Ce, or Lu; R is a substituted or unsubstituted alkyl, alkenyl, or carboxylate group; X is a halide or sulfonate group; and $1 \leq a \leq 2$, $b \geq 1$, $c \geq 1$, and $b+c \leq 5$. The second vapor phase compound is at least one of an amine, a borane, a phosphine, or water. A protective layer is formed over the resist layer. The resist layer is patternwise crosslinked to form a latent pattern in the resist layer. After patternwise crosslinking the resist layer, the protective layer is removed, and the latent pattern is developed by applying a developer to the patternwise crosslinked resist layer to form a pattern exposing a portion of the substrate surface. In an embodiment, the amine, borane, or phosphine includes a halide substituent. In an embodiment, the protective layer is removed during the developing the latent pattern. In an embodiment, the patternwise crosslinking the resist layer includes patternwise exposing the resist layer to extreme ultraviolet radiation through the protective layer, and heating the patternwise exposed resist layer. In an embodiment, the patternwise exposed resist layer is heated at a temperature ranging from 100° C. to 200° C. In an embodiment, the method includes removing a portion of the substrate exposed by the developing. In an embodiment, the method includes heating the resist layer at temperature ranging from 40° C. to 150° C. before patternwise crosslinking the resist layer. In an embodiment, forming the protective layer includes: combining a polymer and a solvent to form a protective layer composition, depositing the protective layer composition over the resist layer, and removing the solvent from the protective layer composition. In an embodiment, the solvent is a polar solvent and the polymer is at least one of a polyvinyl alcohol, a polyacrylic acid, a polymethylacrylic acid, a polyacrylamide, or a polyhydroxystyrene. In an embodiment, the solvent is a nonpolar solvent and the polymer is at least one of a polytetrafluoroethylene, a polyethylene, a polypropylene, or a polystyrene.

Another embodiment of the disclosure is a method of patterning a photoresist layer, including depositing a photoresist layer over a substrate by a vapor phase deposition operation. The photoresist layer includes a reaction product of an organometallic compound and a second compound, wherein the second compound is at least one of an amine, a borane, a phosphine, or water. A protective layer composition including a polymer and a solvent is coated over the photoresist layer to form a protective layer. The photoresist layer is selectively exposed to actinic radiation through the protective layer to form a latent pattern in the photoresist layer. The protective layer is removed, and portions of the photoresist layer not exposed to the actinic radiation are removed to form a pattern of remaining portions of the photoresist layer that were exposed to the actinic radiation during the selectively exposing the photoresist layer. In an embodiment, the method includes removing portions of the substrate exposed by the removing portions of the photoresist layer. In an embodiment, the removing portions of the substrate includes dry etching the substrate. In an embodiment, the removing the portions of the photoresist layer includes applying a plasma to the photoresist layer. In an embodiment, the vapor phase deposition operation includes atomic layer deposition or chemical vapor deposition. In an embodiment, the protective layer is not photosensitive to the actinic radiation. In an embodiment, the method includes after the selectively exposing the photoresist layer to actinic radiation, heating the protective layer and photoresist layer at a temperature ranging from 100° C. to 200° C. In an embodiment, the protective layer is removed during the removing portions of the photoresist layer not exposed to the actinic radiation. In an embodiment, the method includes heating the protective layer and the photoresist layer at a temperature of 40° C. to 150° C. before selectively exposing the photoresist layer to actinic radiation. In an embodiment, the amine is ammonia or hydrazine.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a photoresist layer over a substrate, comprising:
        combining a first precursor and a second precursor in a vapor state to form a photoresist material,
        wherein the first precursor is an organometallic having a formula:

$M_aR_bX_c$ where M is at least one of Sn, Bi, Sb, In, Te, Ti, Zr, Hf, V, Co, Mo, W, Al, Ga, Si, Ge, P, As, Y, La, Ce, or Lu,
        R is a substituted or unsubstituted alkyl, alkenyl, or carboxylate group,
        X is a halide or sulfonate group, and
        $1 \leq a \leq 2$, $b \geq 1$, $c \geq 1$, and $b+c \leq 5$; and
        the second precursor is at least one of an amine, a borane, a phosphine, or water, and
        depositing the photoresist material over the substrate;
    forming a protective layer over the photoresist layer;
    selectively exposing the photoresist layer to actinic radiation through the protective layer to form a latent pattern in the photoresist layer;
    removing the protective layer; and
    developing the latent pattern by applying a developer to the selectively exposed photoresist layer to form a pattern.

2. The method according to claim 1, wherein the protective layer comprises a hydrophilic polymer.

3. The method according to claim 1, wherein the protective layer comprises a hydrophobic polymer.

4. The method according to claim 1, wherein the protective layer comprises a polymer selected from the group consisting of a polyvinyl alcohol, a polyacrylic acid, a polymethylmethacrylate, a polyacrylamide, a polytetrafluoroethylene, a polyethylene, a polypropylene, a polystyrene, a polyhydroxystyrene, a polymethylacrylic acid, and combinations thereof.

5. The method according to claim 1, wherein the forming a protective layer over the photoresist layer comprises spin coating a mixture of a polymer and a solvent over the substrate.

6. The method according to claim 1, further comprising, after selectively exposing the photoresist layer to actinic radiation to form a latent pattern and before removing the protective layer, heating the photoresist layer.

7. The method according to claim 1, further comprising, after forming the protective layer over the photoresist layer and before selectively exposing the photoresist layer to actinic radiation, heating the photoresist layer.

8. The method according to claim 1, wherein the protective layer is removed during the developing the latent pattern.

9. The method according to claim 1, wherein the photoresist material is deposited over the substrate by atomic layer deposition (ALD) or chemical vapor deposition (CVD).

10. A method of manufacturing a semiconductor device, comprising:

depositing a photoresist composition comprising a first organometallic compound and a second compound over a substrate surface via atomic layer deposition (ALD) or chemical vapor deposition (CVD) to form a photoresist layer;

forming a protective layer comprising a polymer over the photoresist layer;

selectively exposing the photoresist layer to actinic radiation through the protective layer to form a latent pattern;

removing the protective layer;

developing the latent pattern by applying a developer to the selectively exposed photoresist layer to form a pattern exposing a portion of the substrate surface; and removing the portion of the substrate surface exposed by the developing.

11. The method according to claim 10, wherein the first organometallic compound is at least one of a sec-hexyl tris(dimethylamino) tin, t-hexyl tris(dimethylamino) tin, i-hexyl tris(dimethylamino) tin, n-hexyl tris(dimethylamino) tin, sec-pentyl tris(dimethylamino) tin, t-pentyl tris(dimethylamino) tin, i-pentyl tris(dimethylamino) tin, n-pentyl tris(dimethylamino) tin, sec-butyl tris(dimethylamino) tin, t-butyl tris(dimethylamino) tin, i-butyl tris(dimethylamino) tin, n-butyl tris(dimethylamino) tin, sec-butyl tris(dimethylamino) tin, i-propyl(tris)dimethylamino tin, n-propyl tris(diethylamino) tin, and analogous alkyl(tris)(t-butoxy) tin compounds, including sec-hexyl tris(t-butoxy) tin, t-hexyl tris(t-butoxy) tin, i-hexyl tris(t-butoxy) tin, n-hexyl tris(t-butoxy) tin, sec-pentyl tris(t-butoxy) tin, t-pentyl tris(t-butoxy) tin, i-pentyl tris(t-butoxy) tin, n-pentyl tris(t-butoxy) tin, t-butyl tris(t-butoxy) tin, i-butyl tris(butoxy) tin, n-butyl tris(butoxy) tin, sec-butyl tris(butoxy) tin, i-propyl(tris)dimethylamino tin, or n-propyl tris(butoxy) tin; and the second compound is at least one of an amine, a borane, a phosphine, or water.

12. The method according to claim 10, wherein the removing a portion of the substrate surface by the developing includes etching the substrate surface.

13. The method according to claim 10, further comprising after selectively exposing the photoresist layer through the protective layer to actinic radiation to form a latent pattern and before removing the protective layer, heating the photoresist layer at a temperature ranging from 100° C. to 200° C.

14. The method according to claim 10, wherein the polymer is at least one of a hydrophilic polymer or a hydrophobic polymer.

15. The method according to claim 10, wherein the protective layer composition is not photosensitive to the actinic radiation.

16. A method of manufacturing a semiconductor device, comprising:

introducing a first compound and a second compound into a chamber at a same time to form a composition of the first compound and the second compound;

depositing the composition of the first compound and the second compound over a substrate via chemical vapor deposition (CVD) to form a layer of the composition of the first compound and the second compound, wherein the first compound is an organometallic compound and the second compound is at least one of an amine, a borane, a phosphine, or water;

forming a protective layer by coating a protective layer composition comprising a polymer and a solvent over the layer of the composition of the first compound and the second compound;

patternwise exposing the layer of the composition of the first compound and the second compound to actinic radiation through the protective layer to form a latent pattern in the layer of the composition of the first compound and the second compound;

removing the protective layer; and developing the patternwise exposed layer of the composition to form a patterned layer of the composition of the first compound and the second compound.

17. The method according to claim 16, wherein the protective layer composition is not photosensitive to the actinic radiation.

18. The method according to claim 16, further comprising after selectively exposing the layer of the composition of the first compound and the second compound through the protective layer to actinic radiation to form a latent pattern and before removing the protective layer, heating the layer of the composition of the first compound and the second compound at a temperature ranging from 100° C. to 200° C.

19. The method according to claim 16, wherein the solvent is a polar solvent and the polymer is hydrophilic polymer.

20. The method according to claim 16, wherein the solvent is a non-polar solvent and the polymer is a hydrophobic polymer.

* * * * *